US012782824B2

(12) United States Patent
Winkler et al.

(10) Patent No.: US 12,782,824 B2
(45) Date of Patent: Nov. 3, 2026

(54) METHOD FOR SIMULATING ILLUMINATION AND IMAGING PROPERTIES OF AN OPTICAL PRODUCTION SYSTEM WHEN ILLUMINATING AND IMAGING AN OBJECT BY MEANS OF AN OPTICAL MEASUREMENT SYSTEM

(71) Applicant: Carl Zeiss SMT GmbH, Oberkochen (DE)

(72) Inventors: Alexander Winkler, Oberkochen (DE); Klaus Gwosch, Oberkochen (DE); Markus Koch, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 176 days.

(21) Appl. No.: 18/679,841

(22) Filed: May 31, 2024

(65) Prior Publication Data

US 2024/0402613 A1 Dec. 5, 2024

(30) Foreign Application Priority Data

Jun. 1, 2023 (DE) ......................... 102023205136.2

(51) Int. Cl.
*G03F 7/00* (2006.01)

(52) U.S. Cl.
CPC ...... *G03F 7/70504* (2023.05); *G03F 7/70091* (2013.01); *G03F 7/70133* (2013.01); *G03F 7/70508* (2013.01)

(58) Field of Classification Search
CPC ............. G03F 7/70504; G03F 7/70666; G03F 7/70133; G03F 7/70091; G03F 7/705;
(Continued)

(56) References Cited

U.S. PATENT DOCUMENTS 9,176,390 B2 11/2015 Layh et al.
2013/0038850 A1* 2/2013 Feldmann ............ G01N 21/956 355/67
(Continued)

FOREIGN PATENT DOCUMENTS

DE 10220815 11/2003 ............... G21K 7/00
DE 10220816 11/2003 ............... G21K 7/00
(Continued)

OTHER PUBLICATIONS

Collett, "Other Polarization Matrix Calculi, the Jones Matrix Calculus", *Field Guide to Polarization*, vol. FG05, pp. 57-61 (Published on Sep. 26, 2005).
(Continued)

*Primary Examiner* — Steven H Whitesell
(74) *Attorney, Agent, or Firm* — Fish & Richardson P.C.

(57) ABSTRACT

A metrology system having an optical measurement system serves to simulate illumination and imaging properties of an optical production system when an object is illuminated and imaged. The optical measurement system has an illumination optical unit serving to illuminate the object and having a pupil stop in the region of an illumination pupil in a pupil plane, and an imaging optical unit for imaging the object in an image plane. At least one pupil stop for specifying a plurality of measurement illumination settings created by displacing the pupil stop in the pupil plane is provided within the scope of the simulation method. Measurement aerial images are recorded in the image plane for various displacement positions of the object perpendicular to the object plane with the various measurement illumination settings. The various measurement illumination settings are specified by displacing the pupil stop. A complex mask transfer function is reconstructed from the recorded measurement aerial images. A 3-D aerial image of the optical production system is determined from the reconstructed
(Continued)

mask transfer function and a given illumination setting of the optical production system as the result of the simulation method. The reconstruction includes the fact that profiles of stop edges of the at least one pupil stop which effectively act to specify the respective measurement illumination setting are changed in a manner going beyond a pure displacement of the stop edge when the respective measurement illumination setting is specified on the basis of the displacement position of the pupil stop. This results in an improvement of the simulation method.

20 Claims, 22 Drawing Sheets

(58) Field of Classification Search
CPC ........... G03F 7/706849; G03F 7/70508; G03F 7/7085; G03F 7/701; G03F 7/70641; G03F 7/70625; G03F 7/7025
See application file for complete search history.

(56) References Cited

U.S. PATENT DOCUMENTS

| | | | | |
|---|---|---|---|---|
| 2013/0063716 | A1 | 3/2013 | Mann et al. | |
| 2013/0083321 | A1 | 4/2013 | Wack et al. | |
| 2017/0132782 | A1 | 5/2017 | Matejka et al. | |
| 2020/0264419 | A1 * | 8/2020 | Diederich | G06V 10/774 |
| 2022/0101569 | A1 | 3/2022 | Dietzel et al. | |
| 2022/0381643 | A1 | 12/2022 | Gwosch et al. | |
| 2022/0390320 | A1 | 12/2022 | Koch et al. | |

FOREIGN PATENT DOCUMENTS

| | | | |
|---|---|---|---|
| DE | 102013219524 | 4/2015 | G01M 11/02 |
| DE | 102019206651 | 11/2020 | G01B 11/00 |
| DE | 102019208552 | 12/2020 | G01B 11/00 |
| DE | 102019215800 | 4/2021 | G01J 9/00 |
| DE | 102021205328 | 9/2022 | G01M 11/02 |
| DE | 102021205541 | 12/2022 | G01M 11/02 |
| DE | 102021213827 | 6/2023 | G01M 11/02 |
| DE | 102022200372 | 7/2023 | G01B 11/00 |
| WO | WO 2012/028303 | 3/2012 | G03F 7/20 |
| WO | WO 2016/012426 | 1/2016 | G02B 17/08 |
| WO | WO 2020/225411 | 11/2020 | G03F 1/84 |
| WO | WO 2021/073994 | 4/2021 | G03F 1/84 |
| WO | WO-2021073993 A1 * | 4/2021 | G03F 7/70616 |
| WO | WO 2023/104687 | 6/2023 | G03F 1/84 |

OTHER PUBLICATIONS

Office Action issued by the German Patent Office for Application No. DE 10 2023 205 136.2 dated Feb. 9, 2024 (with English Machine Translation).

Martin et al., "WLCD: A new System for Wafer Lever CD Metrology on Photomasks," *Proceedings of SPIE*, vol. 7272, Metrology, Inspection and Process Control for Microlithography XXIII, pp. 72722T-1-72722T-9 (Feb. 2009).

Totzeck et al. "How to describe polarization influence on imaging," *Proceedings of SPIE*, vol. 5754, Optical Microlithography XVIII, pp. 23-37 (May 12, 2005).

* cited by examiner

METHOD FOR SIMULATING ILLUMINATION AND IMAGING PROPERTIES OF AN OPTICAL PRODUCTION SYSTEM WHEN ILLUMINATING AND IMAGING AN OBJECT BY MEANS OF AN OPTICAL MEASUREMENT SYSTEM

CROSS-REFERENCE TO RELATED APPLICATION

The present patent application claims the priority of German patent application DE 10 2023 205 136.2, filed on Jun. 1, 2023, the content of which is incorporated herein by reference.

TECHNICAL FIELD

The invention relates to a method for simulating illumination and imaging properties of an optical production system when an object is illuminated and imaged, wherein the simulation is implemented by use of an optical measurement system of a metrology system. Further, the invention relates to a metrology system for carrying out such a method.

BACKGROUND

Such a method and a metrology system to this end are known from DE 10 2019 208 552 A1, DE 10 2019 206 651 B4 and DE 10 2019 215 800 A1. A metrology system for measuring an aerial image of a lithography mask in three dimensions is known from WO 2016/012426 A1. DE 10 2013 219 524 A1 describes a device and a method for determining an imaging quality of an optical system, and an optical system. DE 10 2013 219 524 A1 has described a phase retrieval method for determining a wavefront on the basis of the imaging of a pinhole. The specialist article "A new system for a wafer lever CD metrology on photomasks," Proceedings of SPIE—The International Society for Optical Engineering, 2009, 7272, by Martin et al. has disclosed a metrology system for determining a wafer level critical dimension (CD).

SUMMARY

It is an aspect of the present invention to improve a method for simulating illumination and imaging properties of an optical production system when illuminating and imaging an object by use of an optical measurement system.

This aspect is achieved according to the invention by a simulation method having the features specified in Claim 1.

According to the invention, it was recognized that the recording of measurement aerial images by use of the plurality of pupil stops, in particular the recording of measurement aerial images in a plurality of measurement positions of a pupil stop, which was selected in advance for the best possible simulation of the illumination setting of the optical production system, provides the possibility of improving the accuracy of the simulation method overall and in particular provides the option of reducing illumination angle-dependent artefacts, in particular, in the reconstructed complex mask transfer function, that is to say in the transfer function of the imaged object. It is then possible to correctly take account of 3-D mask effects. This can be taken into account when examining lithography masks, especially when examining masks used for EUV lithography.

The accuracy of the optical production system 3-D aerial image determined by simulation is increased by giving consideration to a dependence of an effective stop edge profile on a respective displacement position of the pupil stop used during the measurement, with this consideration going beyond the pure displacement-related shift of the stop edge contour or stop edge profile. If the pupil stop displacement during the recording of the measurement aerial images is such that the pose of an outer pupil edge, which specifies a numerical illumination aperture in particular, remains constant, then this can be taken into account within the simulation method and simplify modelling of the respective pupil stop edge contour profile at the current measurement position.

The provided pupil stop is an illumination optical unit stop, with the pupil stop being arrangeable in an illumination pupil region regularly present in an illumination optical unit pupil plane.

In addition to that, the optical measurement system may comprise a further stop in a measurement system imaging optical unit for imaging the object. This image-side, further stop can be an aperture stop. A shadowing effect on such an aperture stop can also be taken into account in the simulation method.

In this case, the simulation method may comprise, in particular, a provision of information regarding the respective image-side, further stop utilized, in particular a provision of contour information for this image-side, further stop and also, for instance, information about a thickness of a stop body of the stop.

Taking account of shadowing effects in accordance with Claim 2 is well adapted to pupil stop design practice. It was recognized that such shadowing effects cannot be neglected if the greatest possible simulation accuracy is needed. A thickness of the main body of the pupil stop may be larger than 0.2 mm and may be in the range between 0.2 mm and 5 mm.

Taking account of shadowing effects on account of a finite chief ray angle of the object illumination in the optical production system in accordance with Claim 3 is well adapted to the illumination and imaging requirements of the optical production system. It was also recognized in this respect that such shadowing effects cannot be neglected if the greatest possible accuracy is required during the simulation.

A field-dependent determination in accordance with Claim 4 or 5 leads to an additional improvement in the accuracy of the simulation method since the optical production system to be simulated regularly has field-dependent illumination and/or imaging properties, i.e. illumination and/or imaging properties that depend on the location and the object field or image field.

Within this field-dependent determination, a chief ray angle can be defined by way of two angles on the object. In this case, one of the two angles is an angle of incidence which can be measured with respect to the normal of an object field in particular. The second of the two angles can be an azimuth angle which is measured relative to an initial azimuth angle of 0°, the latter being present when a projection of the incident chief ray on the object field is perpendicular to a field coordinate, wherein this field coordinate can be the field coordinate of the longer field extent in the case of a rectangular object field. In this case, the azimuth angle can be a deviation of a chief ray trajectory of the object illumination from a trajectory in a meridional plane of the optical measurement system.

If both angles are taken into account, then it is possible to consider chief ray angles whose angle of incidence is greater than 4° and whose absolute azimuth angle is greater than 10°.

A correction in accordance with Claim 6, which may include the respective reconstructed spectra of an illumination setting, takes account of an influence on the illumination setting by the optical production system imaging optical unit on the one hand and a corresponding influence of the metrology system measurement optical unit on the other hand. The same reconstructed spectra may be included in both correction terms. This can be used to eliminate errors that occur during the reconstruction of the spectra. The use of corresponding correction terms in the mask transfer function reconstruction is known from DE 10 2019 208 552 A1 and DE 10 2019 206 651 B4.

The use of a pupil stop with a stop shape optimized in accordance with Claim 7 already yields a good simulation of the optical production system illumination properties at the starting point. In that case, the simulation method can be used to obtain highest possible accuracies of the simulation.

A separate optimization for different field regions in accordance with Claim 8 gives rise to a further option for improving the accuracy of the simulation method. The use of a compensation rule, in particular a weighted compensation rule, allows the simulation accuracy to be increased when simulating in the region of field heights for which no measurement pupil stop was provided.

The advantages of a metrology system according to Claims 9 to 12 correspond to those that have already been explained above with reference to the method claims. The pupil stop of the metrology system may have a thickness which is at least 0.2 mm. The thickness of the pupil stop may be, depending on the respective application, in the range between 0.2 mm and 5 mm. A stop shape and/or a stop thickness may be optimized according to the above mentioned method.

A displacement drive for displacing the pupil stop according to Claim 10 has proven its worth for the reproducible specification of pupil stop measurement positions. This applies correspondingly to an object holder, which is displaceable perpendicular to the object plane, and to a displacement drive for displacing an imaging pupil stop according to Claim 11.

A selection apparatus having a stop storage unit according to Claim 12 advantageously enables the pupil stop selection step of the simulation method. In particular, the selection can be made with the aid of a robotic actuation system which takes the respective selected pupil stop from the stop storage unit and moves it to its use location in the pupil plane. The selection apparatus moreover ensures a substitution of a last-used pupil stop for a newly selected pupil stop. In particular, the last-used pupil stop can be transferred from the use location back to the stop storage unit by use of the robotic actuation system in that case.

The selection apparatus may comprise a stop storage unit with a plurality of pupil stops, each with different stop edge shapes and/or stop edge orientations for specifying correspondingly different measurement illumination settings.

An aperture of the stop, i.e. of the illumination pupil stop and/or the imaging pupil stop, may also be variably specifiable, for example in the style of an iris diaphragm.

The metrology system may comprise a light source for the illumination light. A light source of this type may be configured as an EUV light source.

An EUV wavelength of the light source may range between 5 nm and 30 nm. A light source in the DUV wavelength range, for example of the order of 193 nm, is also possible.

Within the scope of the simulation method, it is possible to select precisely one pupil stop from the plurality of pupil stops provided, which may differ in terms of their stop edge shape and/or in terms of their stop edge orientation. Alternatively, it is possible to select and use a plurality of different pupil stops for the purpose of specifying different measurement positions. The pupil stops provided may specify at least one of the following illumination settings in particular: Quadrupole, C-quad, dipole, annular, conventional. A person skilled in the art finds examples for such settings in, inter alia, WO 2012/028 303 A1. First of all, there may be an initial determination of a best focal plane (defocus value $z_m$=0) within the preparation of the imaging method. z-increments when determining the 3-D aerial image in the last step of the simulation method, i.e. when determining the aerial image from the reconstructed mask transfer function and the optical production system illumination setting, may differ from defocus values that may at first be specified in the simulation method. Pixel sizes of the recorded measurement aerial images may be sampled for the purpose of an adaptation to the desired pixel resolution.

The target pupil stop, which can be specified, and the target stop edge shape thereof may relate to a plurality of, or else a multiplicity of, individual illumination or pupil spots, i.e. a plurality of stop apertures for example arranged in a grid-like manner. Such illumination or pupil spots may yield an illumination setting used within the scope of the production illumination, the said illumination setting for example being able to be set by way of an illumination optical unit having a field facet mirror and a pupil facet mirror.

BRIEF DESCRIPTION OF DRAWINGS

Exemplary embodiments of the invention are explained in greater detail below with reference to the drawing, in which:

FIGS. 2A to 9D show different variants of a metrology system pupil stop which is arrangeable in the region of an illumination pupil of the illumination optical unit;

DETAILED DESCRIPTION

Figure 1:
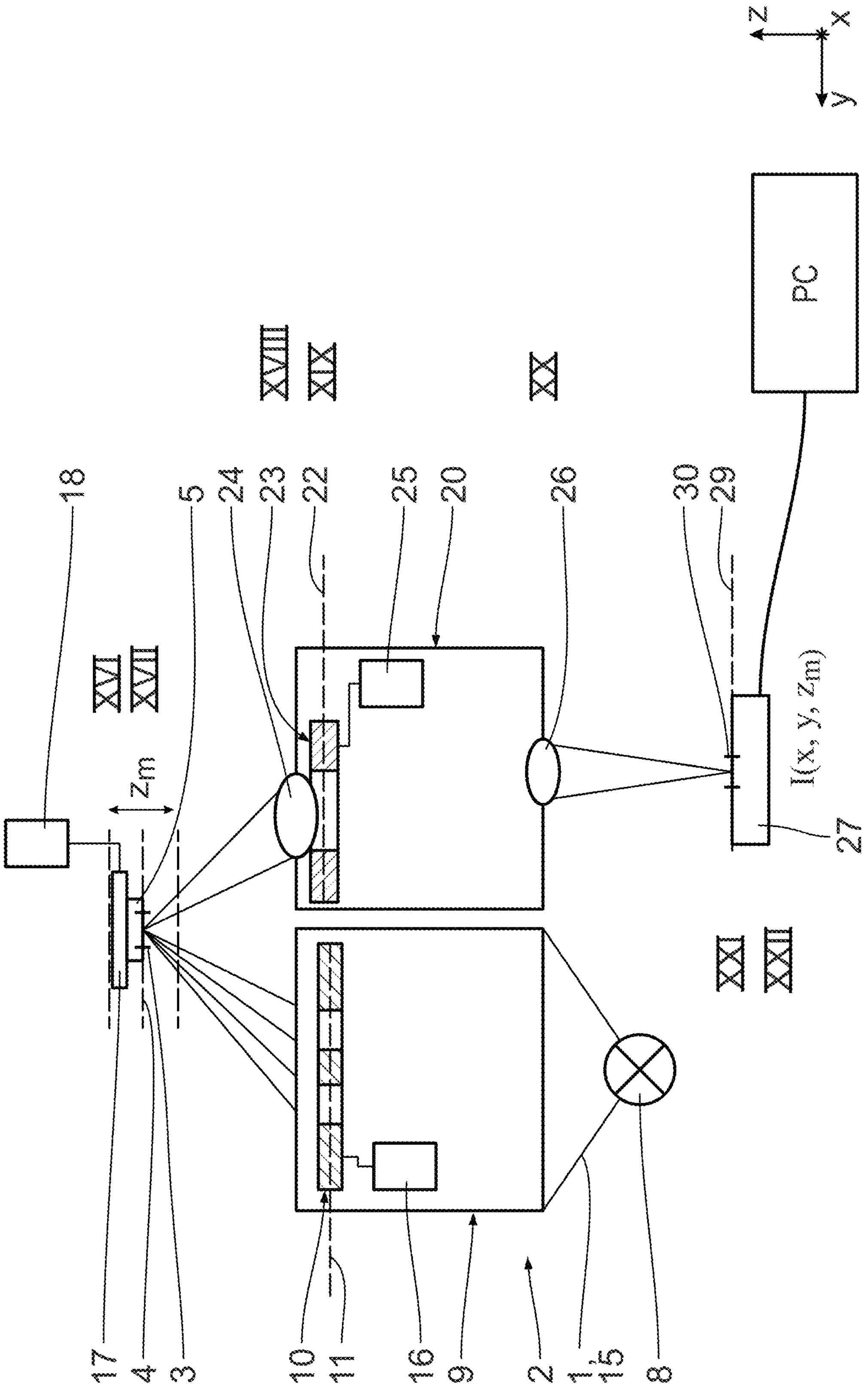
FIG. 1 very schematically shows a side view of a metrology system for simulating illumination and imaging properties of an optical production system when illuminating and imaging an object, the metrology system comprising an illumination optical unit and an imaging optical unit, both of which are depicted very schematically in each case.

In order to facilitate the representation of positional relationships, a Cartesian xyz-coordinate system will be used hereinafter. In FIG. 1, the x-axis extends perpendicularly to the plane of the drawing into the latter. The y-axis extends to the left in FIG. 1. The z-axis extends vertically upwards in FIG. 1.

In a view that corresponds to a meridional section, FIG. 1 shows a beam path of EUV illumination light or imaging light 1 in a metrology system 2 for simulation of illumination and imaging properties of an optical production system when an object is illuminated and imaged by use of an optical measurement system of the metrology system 2. In this case, a test structure 5 arranged in an object field 3 in an object plane 4 is imaged.

Figure 16:
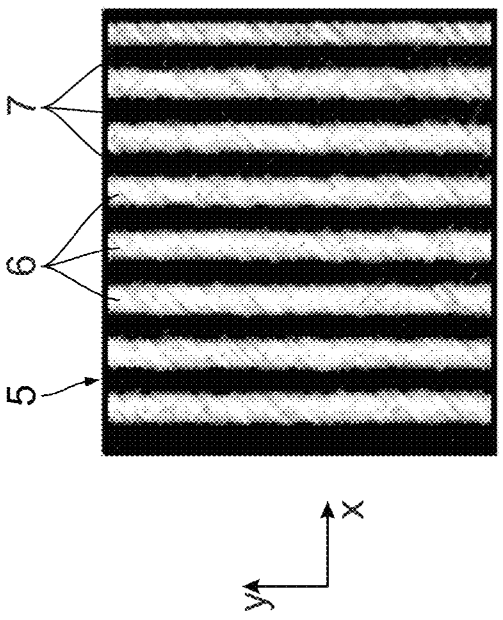
FIG. 16 shows a plan view of a binary, periodic test structure which is arranged at XVI in the metrology system according to FIG. 1.

An example of the test structure 5 is depicted in a plan view in FIG. 16. The test structure 5 is periodic in one dimension, specifically along the y-coordinate for example. The test structure 5 is embodied as a binary test structure with absorber lines 6 and in each case alternating multilayer lines 7 which reflect the illumination light 1. The lines 6, 7 are vertical structures, which extend e.g. along the y-direction.

The metrology system 2 is used to analyze a three-dimensional (3-D) aerial image (aerial image metrology system). One application is found in the simulation of an aerial image of a lithography mask, in the way that the aerial image would also appear in an optical production system of a producing projection exposure apparatus, for example in a scanner. To this end, an imaging quality of the metrology system 2 itself, in particular, can be measured and optionally adjusted. Consequently, the analysis of the aerial image can serve to determine the imaging quality of a projection optical unit of the metrology system 2, or else to determine the imaging quality of, in particular, projection optical units within a projection exposure apparatus. Metrology systems are known from DE 10 2019 208 552 A1, from WO 2016/012 426 A1, from US 2013/0063716 A1 (cf. FIG. 3 therein), from DE 102 20 815 A1 (cf. FIG. 9 therein), from DE 102 20 816 A1 (cf. FIG. 2 therein) and from US 2013/0083321 A1.

The illumination light 1 is reflected and diffracted at the test structure 5. A plane of incidence of the illumination light 1 is parallel to the yz-plane in the case of the central, initial illumination.

The EUV illumination light 1 is produced by an EUV light source 8. The light source 8 can be a laser plasma source (LPP; laser produced plasma) or a discharge source (DPP; discharge produced plasma). In principle, a synchrotron-based light source can also be used, e.g. a free electron laser (FEL). A used wavelength of the EUV light source can range between 5 nm and 30 nm. In principle, in one variant of the metrology system 2, a light source for another used light wavelength can also be used instead of the light source 8, for example a light source for a used wavelength of 193 nm.

An illumination optical unit 9 of the metrology system 2 is arranged between the light source 8 and the test structure 5. The illumination optical unit 9 serves for the illumination of the test structure 5 to be examined, with a defined illumination intensity distribution over the object field 3 and at the same time with a defined illumination angle distribution with which the field points of the object field 3 are illuminated. Such an illumination angle distribution is also referred to as illumination setting.

The respective illumination angle distribution of the illumination light 1 is specified by way of a pupil stop 10, which is arranged in an illumination optical unit pupil plane 11. The pupil stop 10 is also referred to as a sigma stop.

FIGS. 2A to 9B show possible embodiments of such pupil stops 10, which can be used as alternatives in the illumination optical unit 9 of the metrology system 2 for the purpose of specifying the illumination setting. Components and functions corresponding to those already explained in relation to a preceding figure are not discussed again in detail in a subsequent figure, and, where applicable, are denoted there using the same reference signs.

Figure 2A:
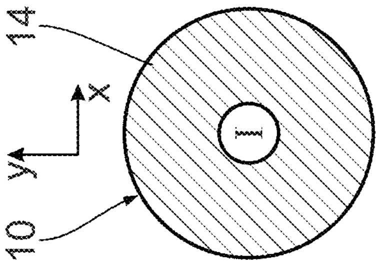

FIG. 2A shows a pupil stop 10 with a single central passage pole I. A radius of this passage pole I is approximately a quarter of a diameter of a peripheral aperture stop portion 14 of the pupil stop 10. A central illumination angle for the object field 3 with relatively small angular variation is selected by way of the pupil stop 10 according to FIG. 2A.

Figure 2B:
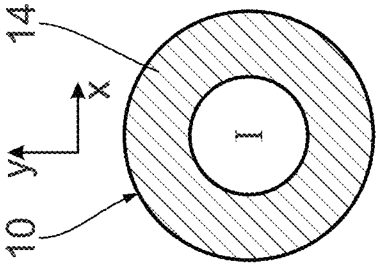
Figure 2C:
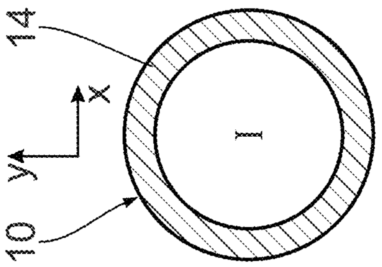
Figure 2D:
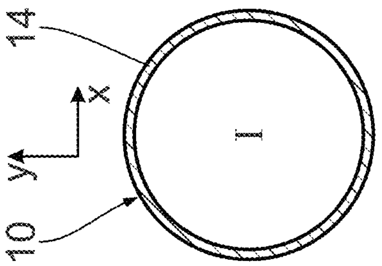

Further variants of pupil stops 10 with a central passage pole I of increasingly larger radius are shown in FIGS. 2B to 2D. There is an according increase in object field illumination angle variation when the pupil stops 10 according to FIGS. 2B to 2D are used. The pupil stop 10 according to FIG. 2D yields a conventional illumination setting, in which light can pass through the illumination optical unit pupil plane 11 of the metrology system 2 practically unimpeded.

Figure 3A:
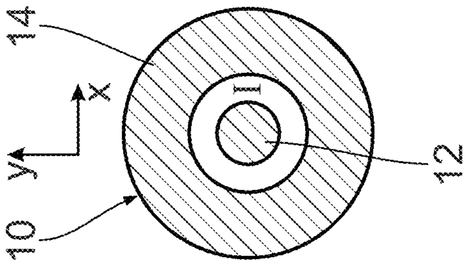

FIG. 3A shows a variant of a pupil stop 10 with a ring-shaped passage portion I, which is arranged around a round, central obscuration stop portion 12. An internal diameter of the ring-shaped passage pole I for the pupil stop according to FIG. 3A is approximately the same size as an external diameter of the illumination pole I of the pupil stop 10 according to FIG. 2A. An external diameter of the ring-shaped passage pole I of the pupil stop 10 according to FIG. 3A is approximately twice the size.

Figure 3B:
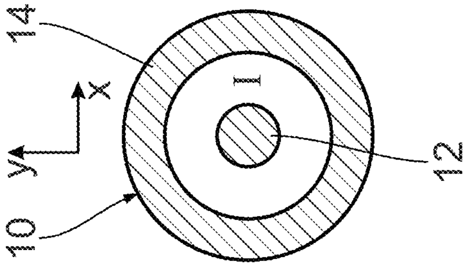

FIG. 3B shows a variant of the pupil stop 10 in which, in comparison with FIG. 2A, an external diameter of the ring-shaped passage pole I is approximately 2.5-times as large as the internal diameter. The central obscuration stop portion 10 for the pupil stop 10 according to FIG. 3B is the same size as the one according to FIG. 3A.

Figure 3C:
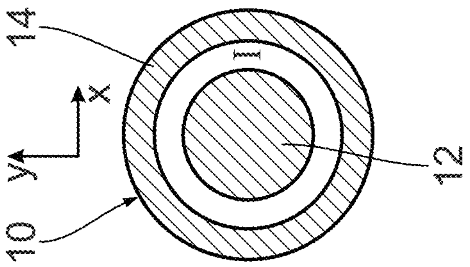

FIG. 3C shows a variant of the pupil stop 10 with a ring-shaped passage pole I with an internal diameter approximately doubled in size in comparison with that of FIGS. 3A and 3B, and with an external diameter that is only slightly larger than that of the passage pole I according to FIG. 3B. This results in a correspondingly large central obscuration stop portion 12.

Figure 3D:
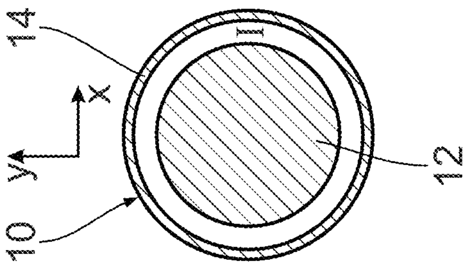

FIG. 3D shows an illumination pupil 10 with a ring-shaped illumination pole I, the ring-shaped thickness of which approximately corresponds to that of the embodiment according to FIG. 3C, with a diameter of the ring-shaped illumination pole I being maximized in the embodiment according to FIG. 3D, and so only a relatively thin aperture stop portion 14 remains on the side of the edge. This results in a correspondingly large central obscuration stop portion 12, which is larger in the embodiment according to FIG. 3D than in the embodiment according to FIG. 3C.

Corresponding annular illumination settings can be realized using the embodiments of the pupil stops 10 according to FIGS. 3A to 3D.

Figure 4A:
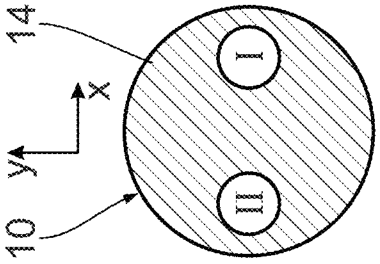

FIG. 4A shows a dipole pupil stop 10 embodied as an x-dipole. The two poles I and II are round in each case and have a diameter which in each case corresponds to the diameter of the central passage pole I of the pupil stop 10 according to FIG. 2A.

Figure 4B:
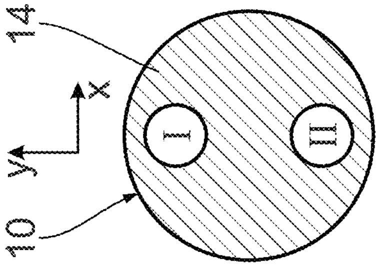

FIG. 4B shows a dipole pupil stop 10 embodied as a y-dipole with poles I, II which correspond to those of the embodiment according to FIG. 4A in terms of their shape and size. The pupil stop 10 according to FIG. 4B can be produced by rotating the pupil stop 10 according to FIG. 4A through 90° about an axis parallel to the z-axis.

Figure 4C:
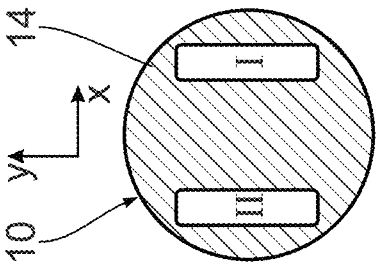

FIG. 4C shows a further embodiment of an x-dipole pupil stop 10 with passage poles I, II which have a rectangular embodiment with an x/y-aspect ratio of approximately 1/4.

Figure 4D:
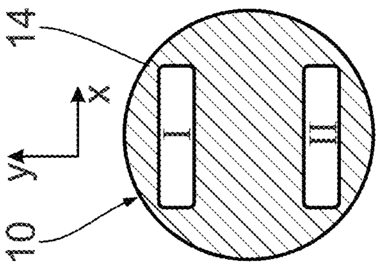

FIG. 4D shows a y-dipole pupil stop 10 corresponding to the x-dipole pupil stop 10 according to FIG. 4C.

Figure 5A:
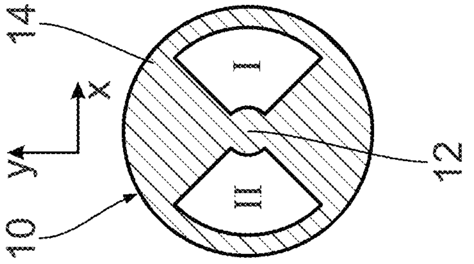

FIG. 5A in turn shows an x-dipole pupil stop 10, with each of the open poles I, II having a circumferential extent of approximately 90°. Once again, a central obscuration stop portion 12 is located between the two passage poles I, II.

Figure 5B:
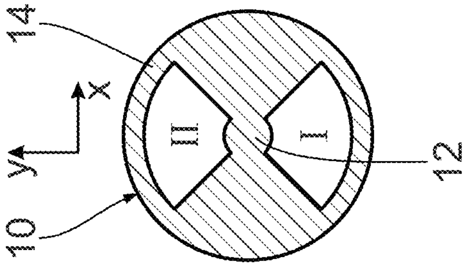

FIG. 5B in turn shows a y-dipole pupil stop 10 corresponding to the x-dipole pupil stop 10 according to FIG. 5A.

Figure 5C:
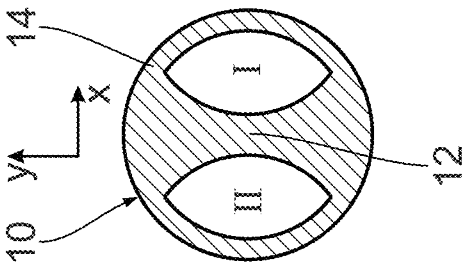

FIG. 5C shows an x-dipole pupil stop 10, in which the individual poles I, II are embodied as leaflets, i.e. each have a biconvex shape.

Figure 5D:
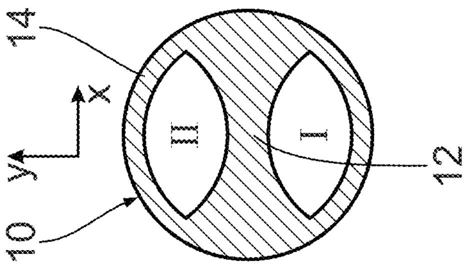

FIG. 5D shows a y-dipole pupil stop 10 corresponding to the x-dipole pupil stop 10 according to FIG. 5C.

Figure 6A:
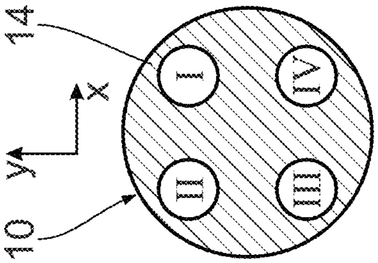

FIG. 6A shows an embodiment of a quadrupole pupil stop 10 with four round passage poles I, II, III and IV arranged in the quadrants. A diameter of these passage poles I to IV corresponds to that of the passage pole I of the pupil stop 10 according to FIG. 2A.

Figure 6B:
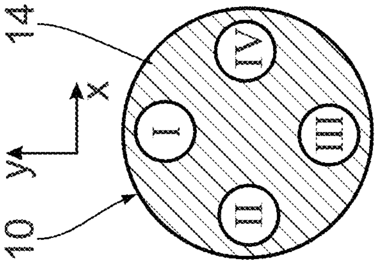

FIG. 6B shows a variant of the pupil stop 10 which can be produced from the variant according to FIG. 6A by way of a twist through 45° about an axis parallel to the z-axis, in which variant the four poles I to IV are thus arranged as a superposition of an x-dipole pupil stop and a y-dipole pupil stop according to FIGS. 4A and 4B.

Figure 6C:
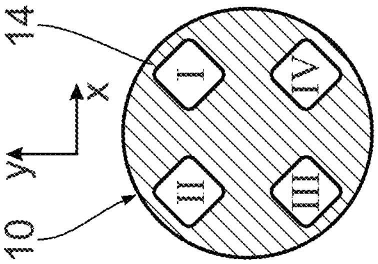

FIG. 6C shows a variant of a corresponding quadrupole pupil stop 10 with square passage poles I to IV, once again arranged in the quadrants.

Figure 6D:
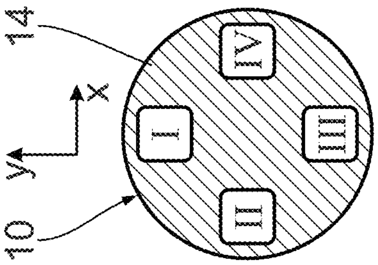

FIG. 6D in turn shows the arrangement corresponding to FIG. 6B, albeit with square passage poles I to IV, rotated through 45° in comparison with FIG. 6C.

Figure 7A:
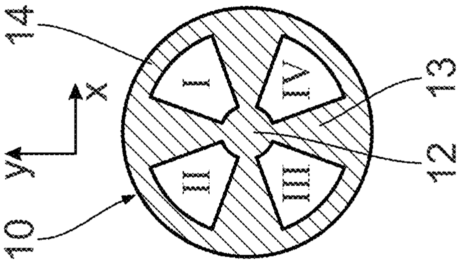

FIG. 7A shows a variant of a quadrupole pupil stop 10 with sector-type poles I to IV arranged in the quadrants, each having a circumferential extent of approximately 45°. Connecting pieces 13 between adjacent passage poles I to IV of the pupil stop 10 according to FIG. 7A likewise have a circumferential extent of approximately 45° in each case. Once again, a central obscuration stop portion 12 is located in the center of the pupil stop 10 according to FIG. 7A.

Figure 7B:
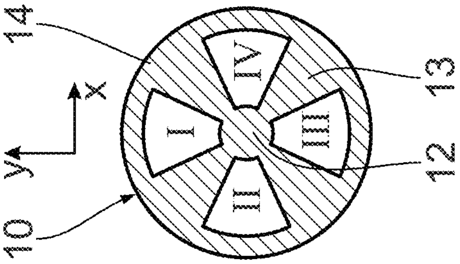

FIG. 7B shows a quadrupole pupil stop 10 which corresponds to the embodiment according to FIG. 7A and which can be produced by rotation through 45° about an axis parallel to the x-axis.

Figure 7C:
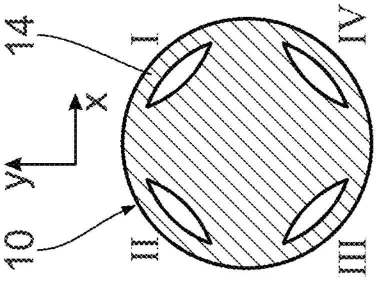

FIG. 7C shows a variant of a quadrupole pupil stop 10 with passage poles I to IV in the form of leaflets which, in the circumferential direction around a stop center, are arranged in the vicinity of the aperture stop portion 14 on the side of the edge.

Figure 7D:
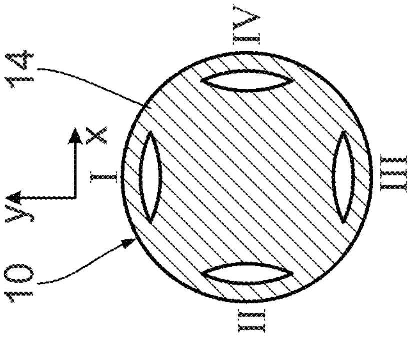

FIG. 7D shows a variant of the quadrupole pupil stop which corresponds to that according to FIG. 7C and which can be produced by rotation through 45° about an axis parallel to the z-axis.

Figures 8A, 8B, 8C, 8D, 9A, 9B, 9C, 9D:
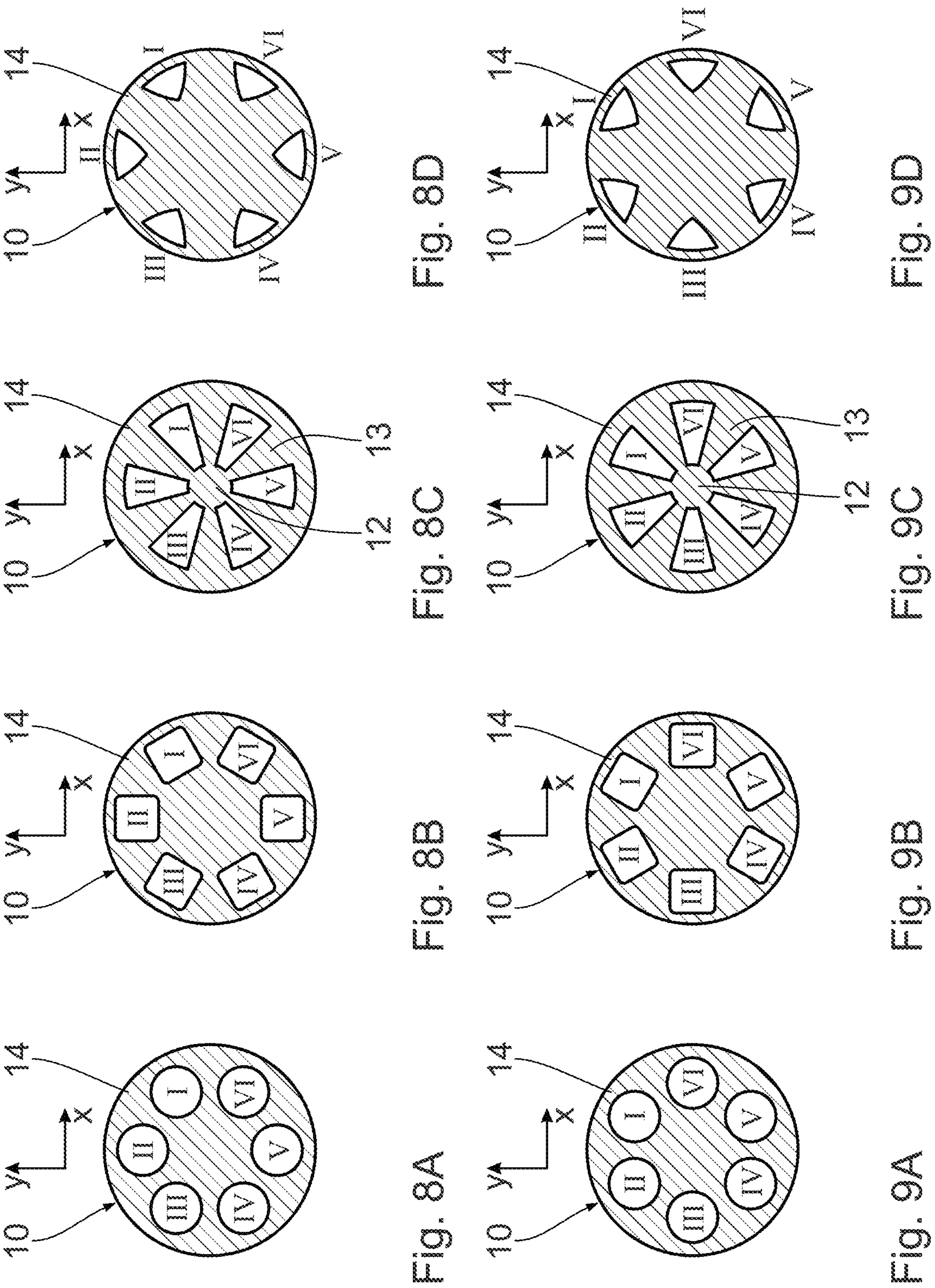

FIG. 8A shows a hexapole pupil stop 10 with six round passage poles I to VI which are arranged about the stop center—so as to be uniformly distributed in the circumferential direction. A diameter of the poles I to VI corresponds to that of the passage pole I of the pupil stop 10 according to FIG. 2A. A distance between two adjacent poles I to VI is approximately one third of a pole diameter.

Measured from the x-coordinate of the pupil stop 10 of FIG. 8A, the six poles are arranged at the positions of 30°, 90°, 150°, 210°, 270° and 330°.

FIG. 8B shows a variant of a hexapole pupil stop 10 which corresponds to that according to FIG. 8A, apart from the edge contour of the passage poles I to VI which is square in the embodiment according to FIG. 8B.

FIG. 8C shows a variant of a hexapole pupil stop 10 which corresponds to that according to FIG. 8A, apart from the edge contour of the passage poles I to VI which is sector-type in the embodiment according to FIG. 8C. A circumferential extent of the sector-type passage poles I to VI is approximately 30° and corresponds to a circumferential extent of the connecting pieces between in each case adjacent passage poles I to VI.

FIG. 8D shows a variant of a hexapole pupil stop 10 which corresponds to that according to FIG. 8A, apart from the edge contour of the passage poles I to VI which is approximately triangular near the aperture stop portion 14 on the side of the edge in the embodiment according to FIG. 8D.

FIG. 9A shows a variant of a hexapole pupil stop 10 which can be produced from the variant according to FIG. 8A by way of a rotation through 30° about an axis parallel to the z-axis.

FIG. 9B shows a variant of a hexapole pupil stop 10 which can be produced from the variant according to FIG. 8B by way of a rotation through 30° about an axis parallel to the z-axis.

FIG. 9C shows a variant of a hexapole pupil stop 10 which can be produced from the variant according to FIG. 8C by way of a rotation through 30° about an axis parallel to the z-axis.

FIG. 9D shows a variant of a hexapole pupil stop 10 which can be produced from the variant according to FIG. 8D by way of a rotation through 30° about an axis parallel to the z-axis.

The pupil stop 10 of the illumination optical unit 9 is embodied as a stop which is displaceable in driven fashion and which is arranged in front of the object plane 4 in an illumination light beam path 15 of the illumination light 1. A drive unit used for the driven displacement of the pupil stop 10 is depicted at 16 in FIG. 1. By use of the drive unit 16, also referred to as a displacement drive, the pupil stop can be displaced along the x-coordinate and/or along the y-coordinate. A fine setting along the z-coordinate for the purpose of adjusting a match of an arrangement plane of the pupil stop 10 relative to the illumination optical unit pupil plane 11 is also possible by way of the drive unit 16. Moreover, the drive unit 16 can be designed such that a tilt of the stop about at least one tilt axis parallel to the x-axis and/or parallel to the y-axis is possible. Additionally, a diameter of the obscuration stop portion 12 and/or aperture stop portion 14 and/or a size of the poles I; I, II; I, II, III, IV; I, II, III, IV, V, VI of the respective embodiment of the pupil stop 10 may be specifiable in settable and, in particular, driven fashion.

With the aid of the displacement drive 16, it is possible to displace the selected pupil stop 10 along the pupil coordinates $k_x$ and $k_y$ in the pupil plane 11.

The displacement drive 16 may also include a stop interchange unit, by use of which a specific pupil stop 10 is replaced with another, specific pupil stop 10. To this end, the stop interchange unit may take the respective selected pupil stop from a stop storage unit and return the replaced stop to this stop storage unit.

The test structure 5 is held by an object holder 17 of the metrology system 2. The object holder 17 cooperates with an object displacement drive 18 for displacing the test structure 5, in particular along the z-coordinate.

Figure 17:
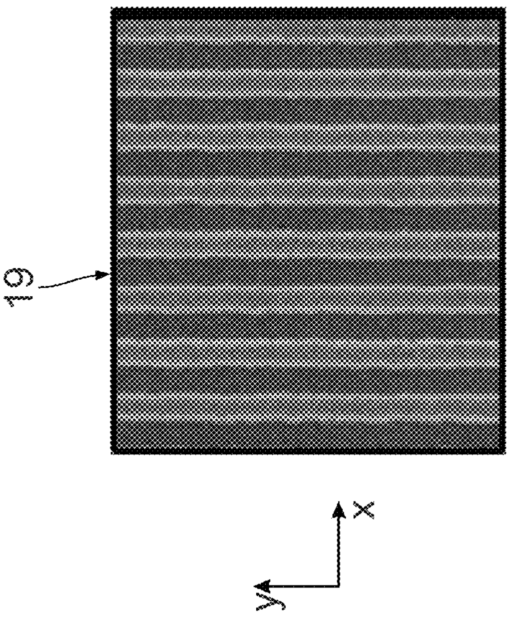
FIG. 17 shows, likewise in a plan view according to FIG. 16, a field distribution of an electromagnetic field of the illumination light in the illumination light beam path at XVII in FIG. 1, following an irradiation of the test structure.
Figure 18:
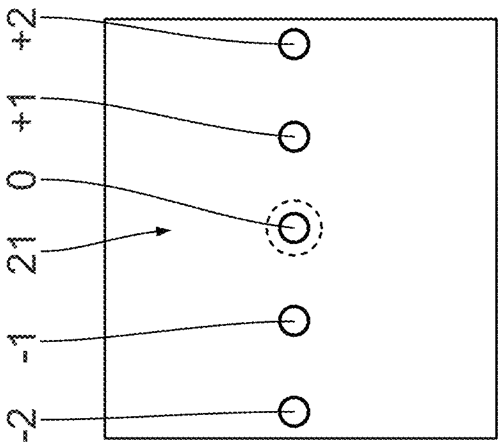
FIG. 18 shows, once again in a plan view according to FIG. 16, a diffraction spectrum of the test structure in the illumination light beam path at XVIII in FIG. 1.

Following reflection at the test structure 5, the electromagnetic field of the illumination light 1 has a distribution 19 which is depicted in FIG. 18 in a plan view corresponding to that of FIG. 17. In the field distribution 19, amplitudes and phase values correspond to the absorber lines 6 and the multilayer lines 7 of the test structure 5.

The illumination light 1 reflected by the test structure 5 enters an imaging optical unit or projection optical unit 20 of the metrology system 2.

A diffraction spectrum 21 arises in a pupil plane of the projection optical unit 20 on account of the periodicity of the test structure 5 (cf. FIG. 18).

The 0th order of diffraction of the test structure 5 is present centrally in the diffraction spectrum 21. Moreover, FIG. 18 also reproduces the +/−1st order of diffraction and the +/−2nd order of diffraction of the diffraction spectrum 21.

Figure 27:
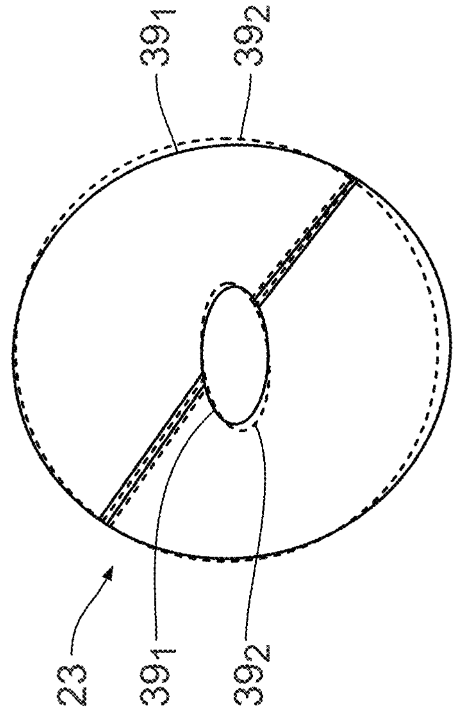
FIG. 27 shows, in a representation similar to FIG. 26, an exit pupil stop of an imaging optical unit of the optical measurement system, with effective stop edges for two different field locations, which correspond to the field locations in FIG. 26, likewise being depicted.

The orders of diffraction of the diffraction spectrum 21 depicted in FIG. 18 appear in this form in a pupil plane of the optical system of the metrology system 2, for example in an entrance pupil plane 22 of the projection optical unit 20. An aperture stop 23 of the projection optical unit 20 which bounds an entrance pupil 24 of the projection optical unit 20 on the edge side, i.e. to the outside for the purpose of specifying the numerical aperture and optionally to the inside for the purpose of specifying an inner obscuration, is arranged in this entrance pupil plane 22. The aperture stop 23 is also referred to as the imaging pupil stop of metrology system 2. FIG. 27 shows an example of such an aperture stop 23 of the metrology system 2.

The imaging pupil stop 23 is operatively connected to a displacement drive 25, the function of which corresponds to that of the displacement drive 16 for the sigma stop 10.

Figure 19:
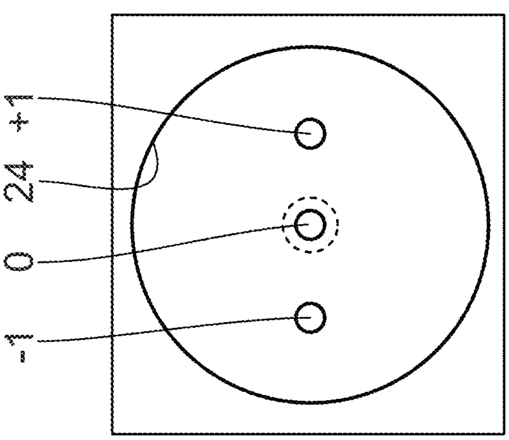
FIG. 19 shows, in a representation similar to FIG. 18, the diffraction spectrum that has been curtailed at the edge on account of an aperture stop of the metrology system, said aperture stop being at XIX in FIG. 1.

FIG. 19 shows the entrance pupil 24 and the three orders of diffraction of the diffraction spectrum 21 which are located within the entrance pupil 24 in the initial illumination angle distribution, specifically the 0th and the +/−1st orders of diffraction.

Figure 20:
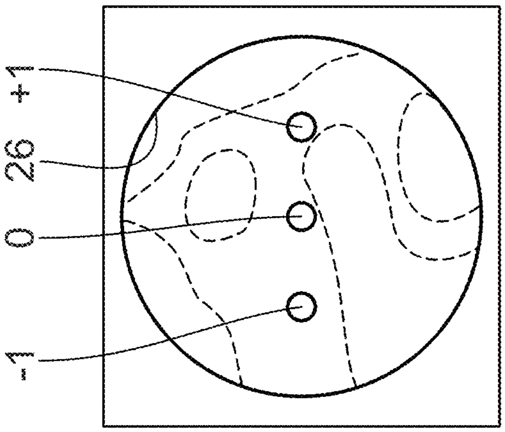
FIG. 20 shows, in a representation similar to FIG. 19, the diffraction spectrum including wavefront influences, indicated as height contours, by the metrology system imaging optical unit as measured spectrum in the region of an exit pupil of the imaging optical unit at XX in FIG. 1.

FIG. 20 shows a distribution of an intensity of the illumination/imaging light 1 in an exit pupil plane of the projection optical unit 20. An exit pupil 26 depicted in FIG. 20 arises as an image of the entrance pupil 24.

The pupils 24 (cf. FIG. 19) and 26 (cf. FIG. 20) are elliptical. The pupils 22, 24 may also have different deviations from the circular form in the case of alternative specifications by way of appropriate aperture stops 21, with the pupils possibly being at least approximately circular. A pupil radius can be calculated as a mean radius. For instance, such alternative pupils can have an elliptical embodiment with an aspect ratio between the semi-axes ranging between 1 and, e.g. 3. The pupils 24 and 26 may also be circular in an embodiment not depicted here.

The intensity distribution in the exit pupil 26 finds contributions firstly from the images of the −1st, 0th and +1st order of diffraction and secondly from an imaging contribution of the optical system, specifically of the projection optical unit 20. This imaging contribution which is elucidated in FIG. 20 by dashed height contours can be described by an optical system transfer function, as is yet to be explained below. Unavoidable imaging aberrations of the optical system lead to a measurable intensity of the illumination/imaging light 1 being present in the exit pupil 26, even in regions around the orders of diffraction.

The projection optical unit 20 images the test structure 5 towards a spatially resolving detection device 27 of the metrology system 2. The detection device 27 is in the form of a camera, in particular a charge-coupled device (CCD) camera or complementary metal-oxide-semiconductor (CMOS) camera.

The projection optical unit 20 is embodied as magnifying optical unit. A magnification factor of the projection optical unit 20 may be greater than 10, may be greater than 50, may be greater than 100 and may even be greater still. As a rule, this magnification factor is less than 1000.

Figure 21:
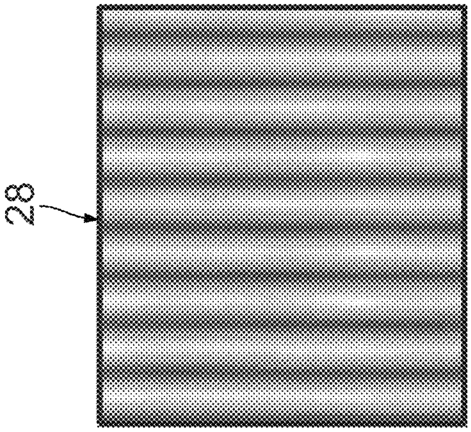
FIG. 21 shows, in a plan view similar to FIG. 17, a complex field distribution of the illumination light upon irradiation of a spatially resolving metrology system detection device in the imaging light beam path at XXI in FIG. 1.

In a manner corresponding to FIG. 18, FIG. 21 shows a complex field distribution 28 of the illumination/imaging light 1 in the region of an image plane 29 in which the detection device 27 is arranged.

Figure 22:
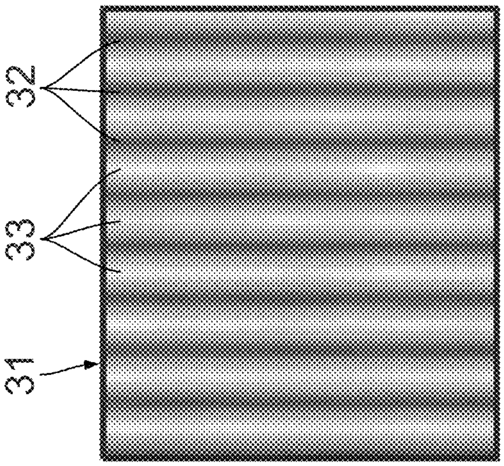
FIG. 22 shows, in a representation similar to FIG. 21, an illumination light intensity, as measured by the detection device, at the location of the detection device at XXII in FIG. 1.

FIG. 22 shows an illumination/imaging light 1 intensity distribution 31, as measured in an image field 30 in the image plane 29 by the camera 27. Images of the absorber lines 6 are present in the intensity distribution 31 as substantially dark lines 32 of low intensity and images of the multilayer lines 7 are present as bright lines 33 of greater intensity in the intensity distribution 31.

The following procedure is carried out to simulate the illumination and imaging properties of the optical production system when illuminating and imaging the object, using the example of the test structure 5, by use of the optical measurement system 1 of the metrology system 2:

Firstly, at least one pupil stop 10 and, for instance, a plurality of pupil stops 10 each with different stop edge shapes are provided for the purpose of specifying correspondingly different measurement illumination settings. This is implemented by providing pupil stops 10, for example in the style of the pupil stops 10 of FIGS. 2A to 9D, in a stop storage unit accessible to the stop interchange unit, which may be part of the displacement drive 16.

Then, a target pupil stop with a target stop edge shape is specified proceeding from an illumination setting of the optical production system to be simulated. The target pupil stop can be an arrangement of a plurality or multiplicity of individual pupil spots or stop spots. In this case, the intensity of individual illumination spots or pupil spots generally differs between the individual spots.

Figure 10:
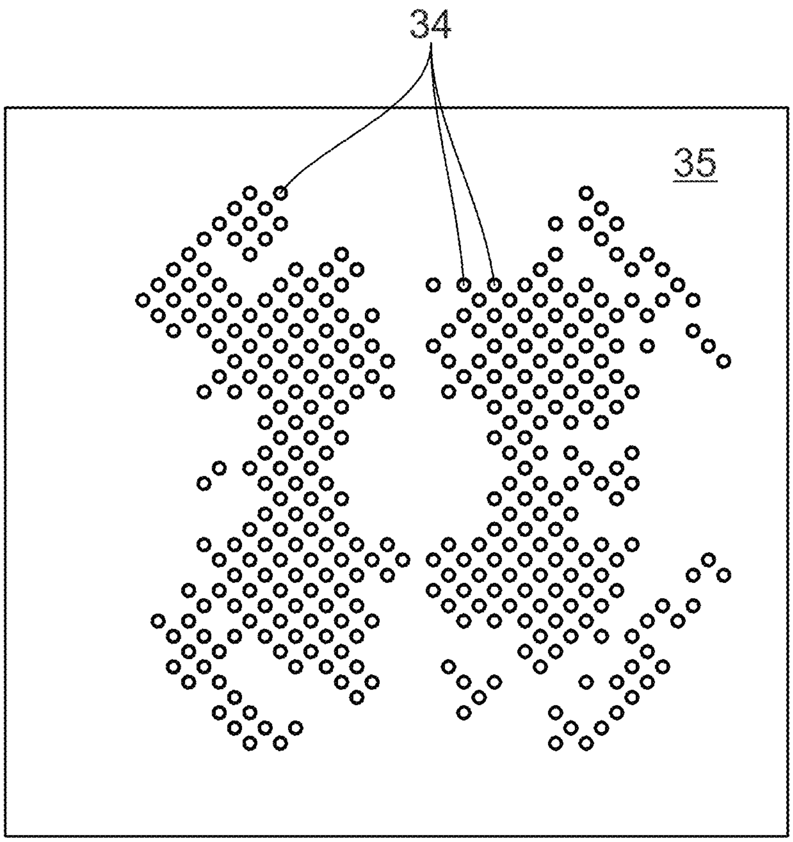
FIG. 10 shows an example of an illumination setting of the optical production system to be simulated, represented by an intensity distribution over an illumination pupil in an optical production system pupil plane.

FIG. 10 shows an example of an illumination setting of the optical production system to be simulated. This production illumination setting in a pupil plane of an optical production system illumination optical unit is provided by way of a fly's eye integrator with a field facet mirror and a pupil facet mirror and comprises a plurality of intensity spots 34, arranged in grid-like fashion, in a production illumination optical unit illumination pupil plane 35. The intensity spots 34 may have different intensities, and so the illumination light from different illumination directions may be incident on the object field 3 with correspondingly different intensities.

Figure 15:
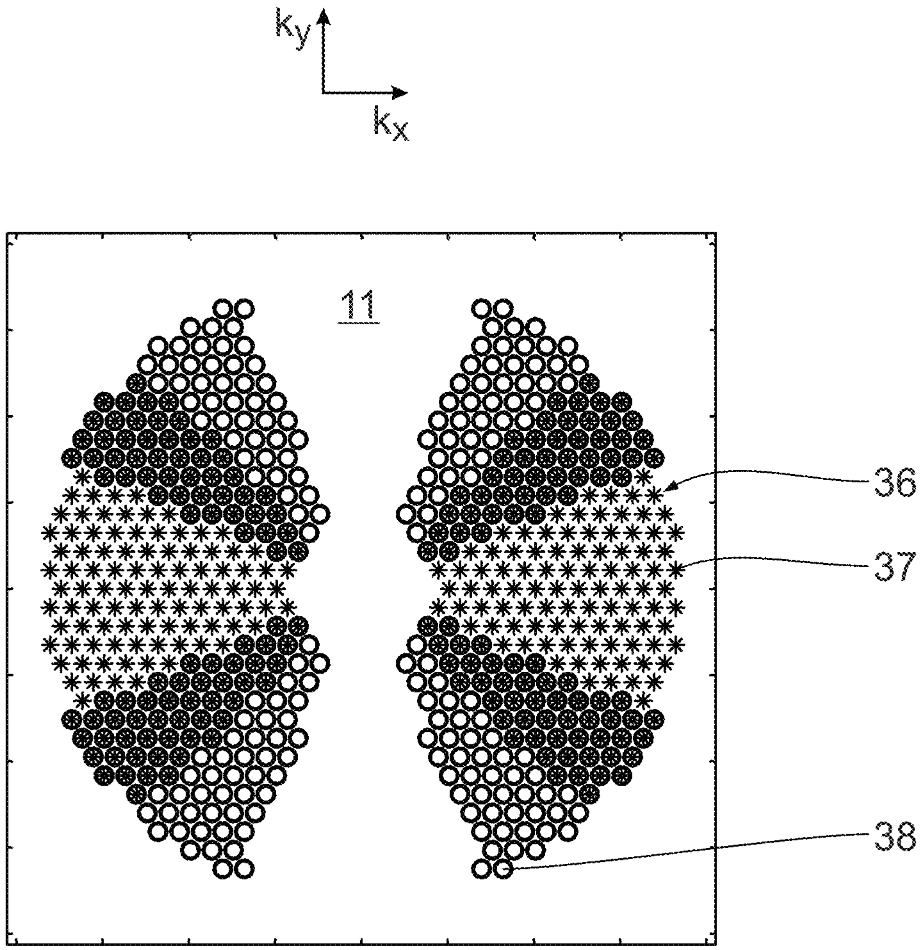
FIG. 15 shows, in a pupil coordinate representation, a comparison between a target illumination setting of the production system, which is intended to be approximated by a metrology system pupil stop, and a pupil stop candidate using the example of a metrology system pupil stop comparable to the pupil stop according to FIG. 7A, with this comparison being part of an algorithm for selecting at least one metrology system pupil stop from the provided plurality of pupil stops.

FIG. 15 likewise shows a target pupil stop 36 in a pupil plane with pupil coordinates $k_x$, $k_y$, the target stop edge shape of said target pupil stop being specified in a manner dependent on the illumination setting of the optical production system to be simulated, for example dependent on the illumination setting according to FIG. 10.

The target pupil stop 36 can be specified by way of a definition of appropriate stop aperture contours, especially continuous stop aperture contours. Such stop aperture contours can be described by polygonal chains, for example.

These continuous openings are then approximated by a finite number of pupil spots 37 within the openings. These spots are depicted in FIG. 15 by way of example.

For the specific example in FIG. 15, the aperture contour of the stop in FIG. 7A was used as measurement stop and the aperture contour of the stop in FIG. 5A was used as target setting. The finer the grid of illumination spots, the more accurately the actual stop shape can be approximated.

FIG. 15 depicts a grid of pupil spots 37 (stars in FIG. 15) which are arranged within the specified target pupil stop 36. This grid arrangement of the pupil spots 37 can take account of shadowing, in particular by way of required connecting pieces of the pupil stop.

Proceeding from this target pupil stop 36, at least one pupil stop 10 is then selected from the provided plurality of pupil stops 10 by use of an algorithm which qualifies deviations between the respective stop edge shape of the provided pupil stops 10 and the target stop edge shape of the target pupil stop 36. To this end, the pupil stop 10 currently under examination during the selection (also referred to as pupil stop to be qualified below) can in turn be decomposed within its stop edge into a plurality of pupil spots 38 arranged in grid-like fashion and represented by circles in FIG. 15.

The scope of qualification comprises determining the similarity between the target illumination pupil (also denoted "T" below) and the possible measurement stops 10 (also denoted "M" below). For instance, this can be implemented by calculating an overlap function Q.

$$Q = \frac{A(M \cap T)}{A(M \cup T)} - \frac{A(M \setminus T)}{A(M)} - \frac{A(T \setminus M)}{A(T)}$$

Here, A is a function for (approximately) calculating the area. The first term corresponds to the normalized area of the overlap between measurement stop and target illumination pupil. The second and third terms correspond to the normalized difference area between the measurement stop and the target illumination pupil, and vice versa. The difference area is intended to refer to the area contained only in the first pupil and not in the second.

The operators "∩", "∪" and "\" correspond to the intersection (∩), union (∪) and relative complement (\) operators from set theory. In this case, the intersection $M_1 \cap M_2$ of the sets/areas $M_1$ and $M_2$ is intended to mean the set/area which is contained both in $M_1$ and in $M_2$, i.e. corresponds to the overlap area of $M_1$ and $M_2$. The union $M_1 \cup M_2$ of the sets/areas $M_1$ and $M_2$ describes the set/area which is contained in $M_1$ or $M_2$, i.e. corresponds to the overall area covered by $M_1$ or $M_2$. The relative complement. $M_1 \setminus M_2$ of the sets/areas $M_1$ and $M_2$ describes the set/area which is covered by $M_1$ but not contained in $M_2$.

For instance, the area function A can be implemented as counting illumination spots in the pupil. To this end, target illumination pupil and measurement pupil are scanned using the same grid. Typically, the grid corresponds to the pupil facet grid in the scanner on which the target illumination pupil is sampled (cf. FIG. 10). Now, the number of spots present in both illumination pupils (first term in the formula above) are counted, as are the spots that are exclusive to only one of the two pupils (second and third term in the formula above). In an alternative to that, comparison of the local spot density or the mean local brightness is also conceivable.

Thus, the selection of the pupil stop 10 encompasses a comparison between the poses of pupil spots 37 of the target stop edge shape and the poses of pupil spots 38 of the provided pupil stops 10.

Moreover, a plurality of defocus values $z_m$ (cf. FIG. 1) are specified as z-distances of a position of the object holder 17 from the object plane 4 (parallel to the xy-plane).

Moreover, a plurality of measurement positions ($k_x$, $k_y$) of the selected pupil stop 10 are specified within the scope of the simulation method.

Now, measurement aerial images $I_{meas}(\vec{r}, z_m, \vec{q}_m)$ are recorded in the image plane 29 at the spatial coordinates $\vec{r}$=x, y, in the style of intensity distributions 31 according to FIG. 22 and for a plurality of combinations of in each case one specified defocus value $z_m$ and one measurement position of the selected pupil stop 10, parameterized by way of an illumination direction $\vec{q}$. This is carried out for all positions of the object holder 17 which are assigned to the previously specified defocus values $z_m$. For at least one of the specified defocus values $z_m$, a plurality of measurement positions ($k_x$, $k_y$) of the selected pupil stop 10 are homed in on by way of the displacement drive 16 in order to make the respective recording of the measurement aerial image I(x,y).

The sequence in FIGS. 11A to 11I shows such a combination of one defocus value $z_m$ and a total of nine measurement positions ($k_x$, $k_y$) of the pupil stop 10, with the pupil stop 10 according to FIG. 2B having been chosen here for the purpose of specifying a conventional illumination setting. Depicted in each case is the position of passage pole I of the pupil stop 10 relative to the position of the imaging pupil stop 23.

Figure 11A:
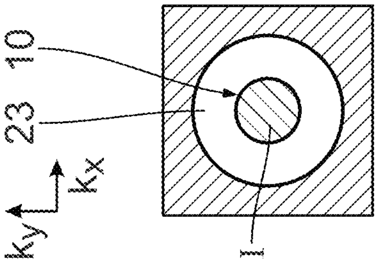
FIGS. 11A to 11I show an embodiment of a sequence of measurement positions of one of the pupil stops according to FIGS. 2 to 9 using the example of the pupil stop according to FIG. 2B, with the measurement position sequence being used within a method, performed by the metrology system, for simulating the illumination and imaging properties of the optical production system when illuminating and imaging the object using the metrology system optical measurement system.

FIG. 11A shows the pupil stop 10 centered with respect to the imaging pupil stop 23. In this starting position according to FIG. 11A, the pupil stop 10 is imaged centered in the aperture of the imaging pupil stop 23.

Figure 11B:
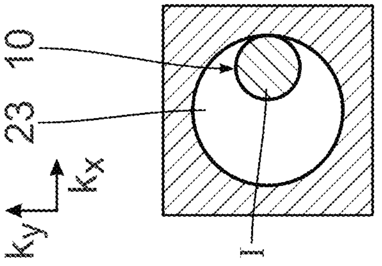
Figure 11C:
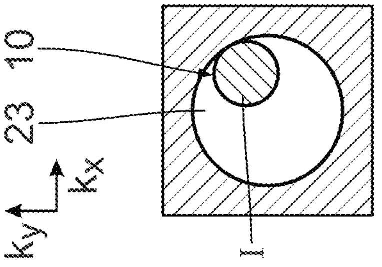
Figure 11D:
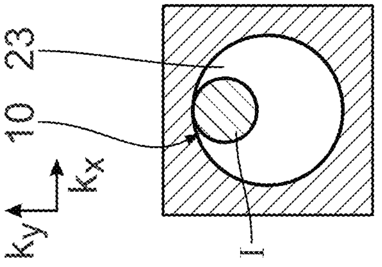
Figure 11E:
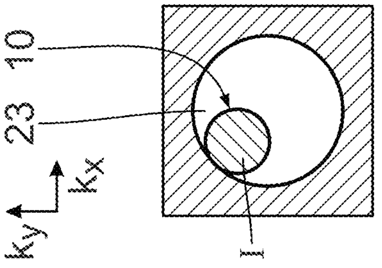
Figure 11F:
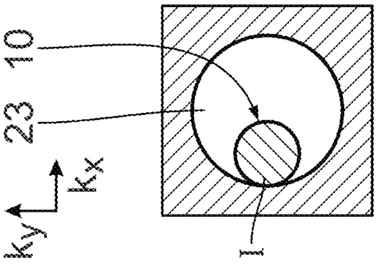
Figure 11G:
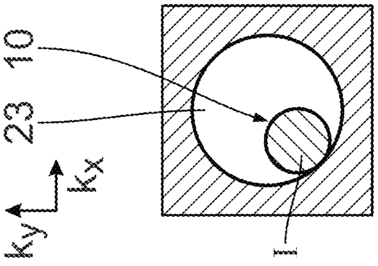
Figure 11H:
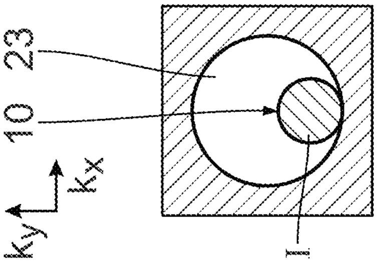
Figure 11I:
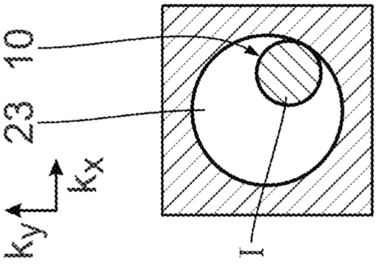
Figure 12A:
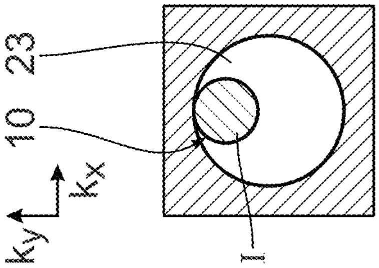
FIGS. 12A to 12F show a further embodiment of a sequence of measurement positions of the metrology system pupil stop in a representation similar to that of FIGS. 11A to 11I.
Figure 12B:
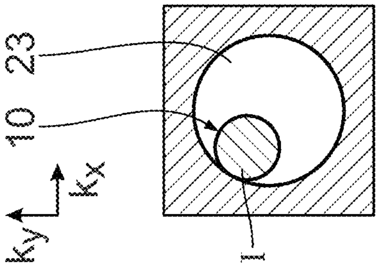
Figure 12C:
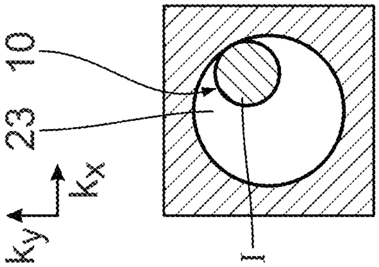
Figure 12D:
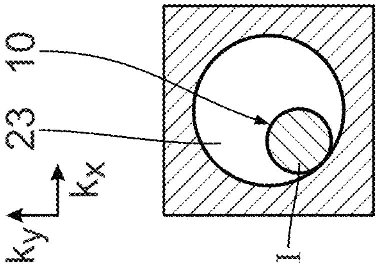
Figure 12E:
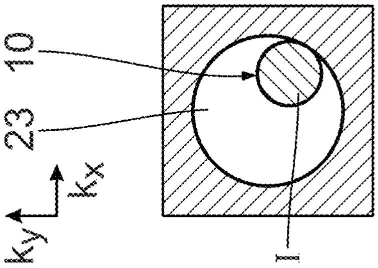
Figure 12F:
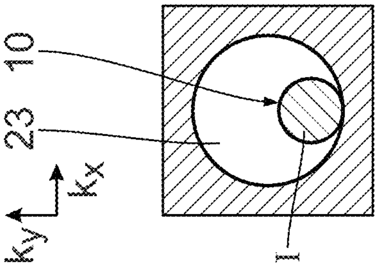

In comparison with the imaging pupil stop 23, FIG. 11B shows the pupil stop 10 displaced from the center position according to FIG. 11A by a specified increment in the positive $k_x$-direction.

In comparison with the centered position according to FIG. 11A, the following sequence in FIGS. 11C to 11I in each case shows a further displacement of the pupil stop 10 through 45° in the circumferential direction, starting from the position according to FIG. 11B. Hence, the measurement positions according to FIGS. 11C, 11E, 11G and 11I show the pupil stop 10 in the positions of the four quadrants I to IV. The measurement positions according to FIGS. 11B, 11D, 11F and 11H show the pupil stop 10 in the Cartesian displacement positions $+k_x$, $+k_y$, $-k_x$, $-k_y$.

An alternative sequence of measurement positions ($k_x$, $k_y$) of the pupil stop 10 is depicted in FIGS. 12A to 12F. This sequence of the measurement positions 12A to 12F corresponds to the measurement positions according to FIGS. 11D, 11E, 11C, 11G, 11I and 11H.

FIGS. 13A to 13I show a further variant of a sequence of measurement positions ($k_x$, $k_y$) of the pupil stop 10.

Figure 13A:
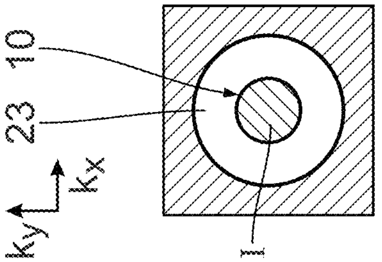
FIGS. 13A to 13I show a further embodiment of a sequence of measurement positions of the metrology system pupil stop in a representation similar to that of FIGS. 11A to 11I.
Figure 13B:
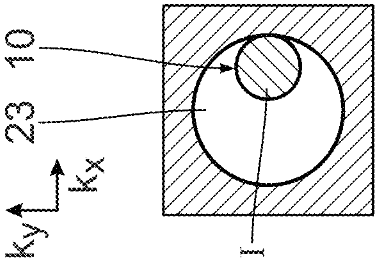

FIG. 13A shows the pupil stop 10 once again centered with respect to the imaging pupil stop 23. In comparison with the imaging pupil stop 23, FIG. 13B shows the pupil stop 10 displaced from the center position according to FIG. 13A by a specified increment in the positive $k_x$-direction.

Figure 13C:
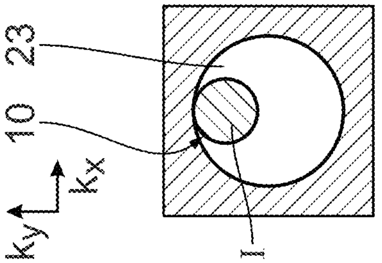

Relative to the imaging pupil stop 23, FIG. 13C shows the pupil stop 10 displaced in the positive $k_y$-direction from the center position according to FIG. 13 by the same increment.

Figure 13D:
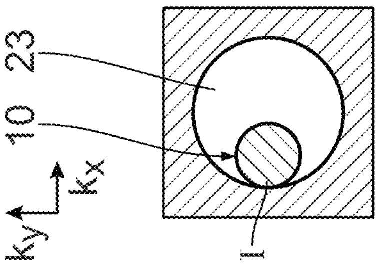

Relative to the imaging pupil stop 23, FIG. 13D shows the pupil stop 10 displaced by the increment in the negative $k_x$-direction starting from the center position according to FIG. 13A.

Figure 13E:
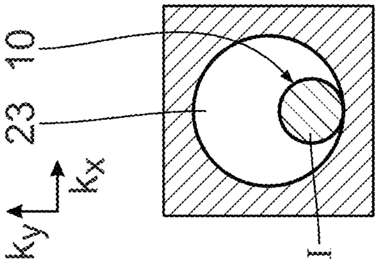
Figure 13F:
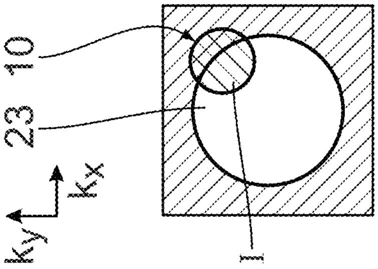
Figure 13G:
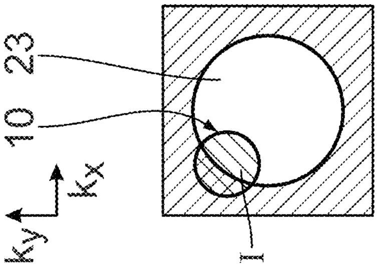
Figure 13H:
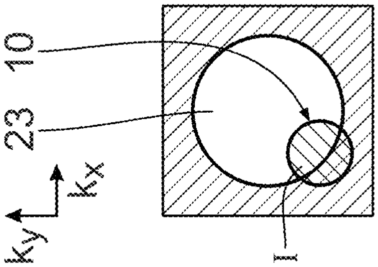
Figure 13I:
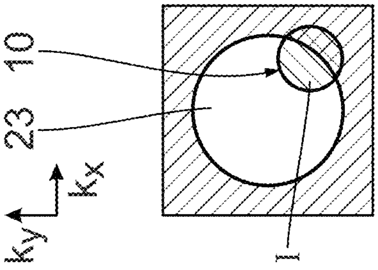

Relative to the imaging pupil stop 23, FIG. 13E shows the pupil stop 10 displaced by the given increment in the negative $k_y$-direction starting from the center position according to FIG. 13A.

The completed sequence of measurement positions ($k_x$, $k_y$) is shown in FIGS. 13F to 13I. The circumferential positions of the pupil stop 10 relative to the imaging pupil stop 23 correspond to the positions according to FIGS. 11C, 11E, 11G and 11I in that case. In contrast to these positions, the pupil stop 10 in the sequence according to FIGS. 13F to 13I has been pushed so far out of the aperture of the imaging pupil stop 23 in the radial direction that only an inner part of the passage spot I of the pupil stop 10 still overlaps with the aperture of the imaging pupil stop 23. Just slightly over half of the area of the passage spot I can be traversed by the illumination light in this case. This yields a complete sequence according to FIGS. 13A to 13I with two displacement radii.

Figure 14A:
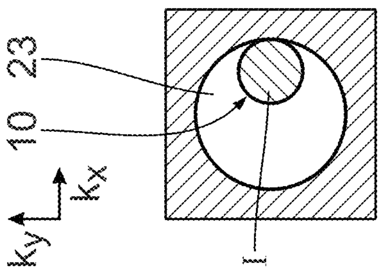
FIGS. 14A to 14C show a further embodiment of a sequence of measurement positions of the metrology system pupil stop in a representation similar to that of FIGS. 11A to 11I.
Figure 14B:
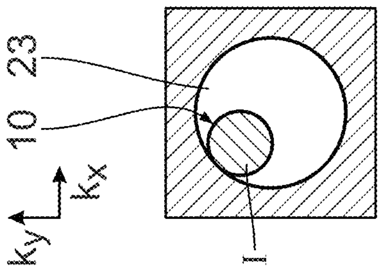
Figure 14C:
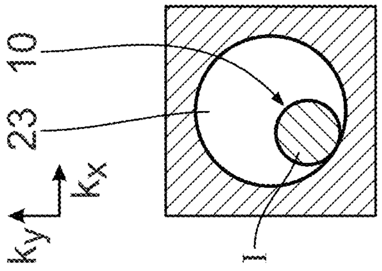

FIGS. 14A to 14C show a further variant of a sequence of measurement positions ($k_x$, $k_y$) of the pupil stop 10. The measurement positions according to FIGS. 14A to 14C correspond to the measurement positions according to FIGS. 11B, 11E and 11G.

The selection of the respective measurement position sequence, or optionally a subset therefrom, is implemented on the basis of the arrangement of individual structures of the test structure 5 and/or on the basis of the illumination setting of the optical production system to be simulated. For instance, the measurement position sequence can be selected in a manner analogous to the stop selection algorithm (see above), with all stop positions of a sequence being taken into account and the sequence being selected for which the overlap of the measurement sequence with the target illumination pupil is maximal.

The poses of the pupil stop 10 which differ from the center position in terms of the relative pose with respect to the imaging pupil stop 23 are also referred to as offset measurement positions. Within the scope of a measurement position sequence, two to ten such offset measurement positions can be homed in on, this typically being two to five offset measurement positions, for example three or four offset measurement positions. The offset measurement positions can be arranged uniformly distributed in the circumferential direction. To reduce the measurement time, it is also possible to use only a subset, e.g. every second measurement position, from the measurement schemes (FIG. 11 to FIG. 14) shown.

The specified defocus values $z_m$ are all measured with the aid of the respective measurement position sequence. In an alternative, it is possible that the entire respective measurement position sequence is used only for one defocus value or for individual defocus values $z_m$, with the measurement aerial images being recorded for fewer measurement positions of the pupil stop relative to the imaging pupil stop 23 in the case of other defocus values $z_m$. In extreme cases, it is possible for instance to home in on the entire measurement position sequence and record a respective measurement aerial image there for only one defocus value $z_m$, whereas the measurement aerial image $I_{meas}$ is only recorded at one respective measurement position, in particular for the centered pupil stop 10, in the case of the other specified defocus values $z_m$.

For instance, the following defocus value/measurement position combinations can be recorded: A central defocus value $z_m$ and a plurality of measurement positions ($k_x$, $k_y$) of the pupil stop 10, i.e., in particular, a centered measurement position and a plurality of offset measurement positions, and defocus values $z_{min}$, $z_{max}$ maximally offset from the central defocus value on both sides, with exactly one central measurement position ($k_x$, $k_y$) of the pupil stop 10 being adopted at these positions $z_{min}$, $z_{max}$.

Then, a complex mask transfer function is reconstructed from the totality of measurement aerial images recorded with the selected pupil stop 10. A similar reconstruction step is also described in DE 10 2019 215 800 A1.

Figure 23:
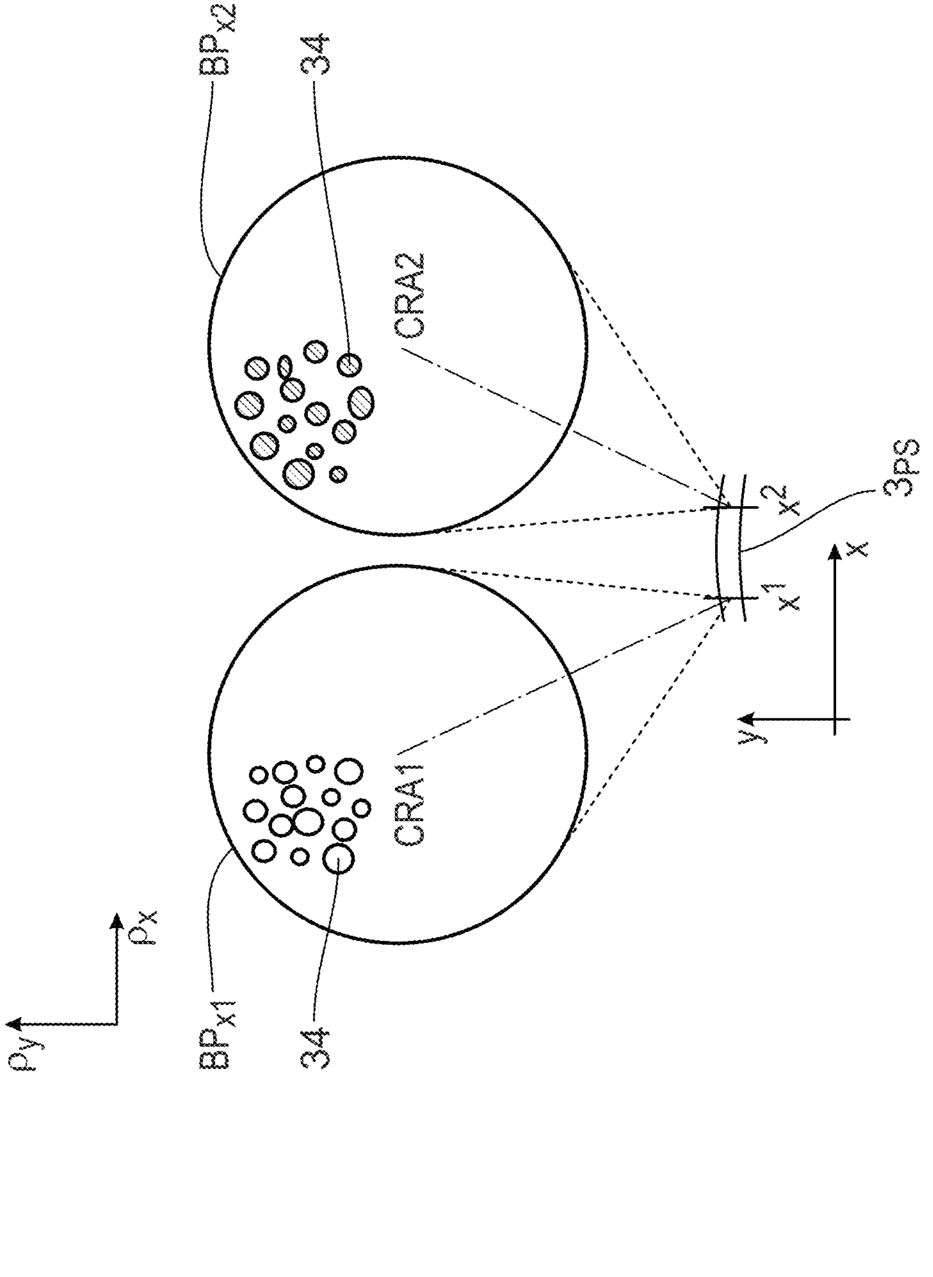
FIG. 23 shows, schematically and in exaggerated form, a field variation of an illumination setting of the optical production system to be simulated, additionally dependent on a chief ray illumination direction.

The reconstruction is implemented within the scope of a modelled description, in which a function $\sigma(\vec{p}, \vec{q})$ reproducing the illumination directions $\vec{p}$ passed through the pupil stop 10 is used to describe the projection optical unit 20 of the metrology system 2 with the illumination setting specified by the pupil stop 10. In contrast to the reconstruction according to DE 10 2019 215 800 A1, for example, a change in the illumination light distribution σ on account of a change in the measurement position of the pupil stop 10 is not limited to a description by way of a pure displacement vector; instead, the description of the illumination light distribution σ includes a chief ray-dependent change in effective edge contours of the pupil stop 10, dependent on the displacement position thereof. Thus, the illumination light distribution depends on, firstly, the pupil coordinate $\vec{p}$, which describes a basic shape of pupil stop edge contours, and on a chief ray illumination direction $\vec{q}$. The illumination light distribution field dependence considered thus is illustrated in more detail with the aid of the figures described below:

FIG. 23 schematically shows a variation of an illumination pupil BP for two different field coordinates $x^1$, $x^2$ in the optical production system, using the example of a projection exposure apparatus embodied as a scanner. Shown with an exaggeratedly large dependence are two illumination pupils $BP_{x1}$, $BP_{x2}$ of an illumination system in the optical production system in the style of the illumination setting from FIG. 10.

By way of $x^1$ and $x^2$, FIG. 23, bottom, depicts two different field points or field heights of the typically ring-shaped optical production system object field $3_{PS}$, also referred to as EUV reticle illumination field. Vertical lines at the x-coordinates $x^1$, $x^2$ indicate that the depicted illumination pupils BP are the results of an integration over the y-component of the field. This models the function of the scanner projection exposure apparatus. Above the field $3_{PS}$, FIG. 23 depicts the two illumination pupils $BP_{x1}$, $BP_{x2}$, i.e. two angular space illuminations which correspond to these x-coordinates and are in each case depicted centered around a chief ray CRA1 and CRA2 [chief ray angle], respectively, of the respective illumination pupil BP. The chief rays CRA1 and CRA2 differ in terms of the chief ray illumination directions, with this difference depicted very exaggeratedly in FIG. 23.

The following variables are depicted schematically in FIG. 23 with a field variation: The illumination chief ray CRAi of the respective illumination pupil BP typically varies continuously from field point to field point $x^i$ of the object field $3_{PS}$. Each intensity spot 34 (image of the source volume or source plasma of the EUV light source 8) of the respective EUV illumination pupil $BP_{x1}$ varies in terms of its pupil coordinate position $$\rho_x^{f,i}, \rho_y^{f,i},$$

in terms of its intensity $I^{f,i}$ and in general also in terms of its shape and polarization, where f indicates a position in the object field $3_{PS}$ and i indicates the respective intensity spot 34. $\rho_x$, $\rho_y$ are the pupil coordinates of the respective intensity spot 34.

In particular, it should be observed that the shapes of the intensity spots 34 of the respective EUV illumination pupil $BP_{x1}$ also vary depending on the direction of the illumination chief ray $CRA_i$. This shape dependence of the intensity spots 34 on the chief ray angle $CRA_i$ can be traced back to optical system aberrations.

The pupil coordinates $\rho_x$, $\rho_y$ used in the description of FIG. 23 correspond to the coordinates $k_x$, $k_y$ used further above, especially in the context of FIG. 15.

Figure 23A:
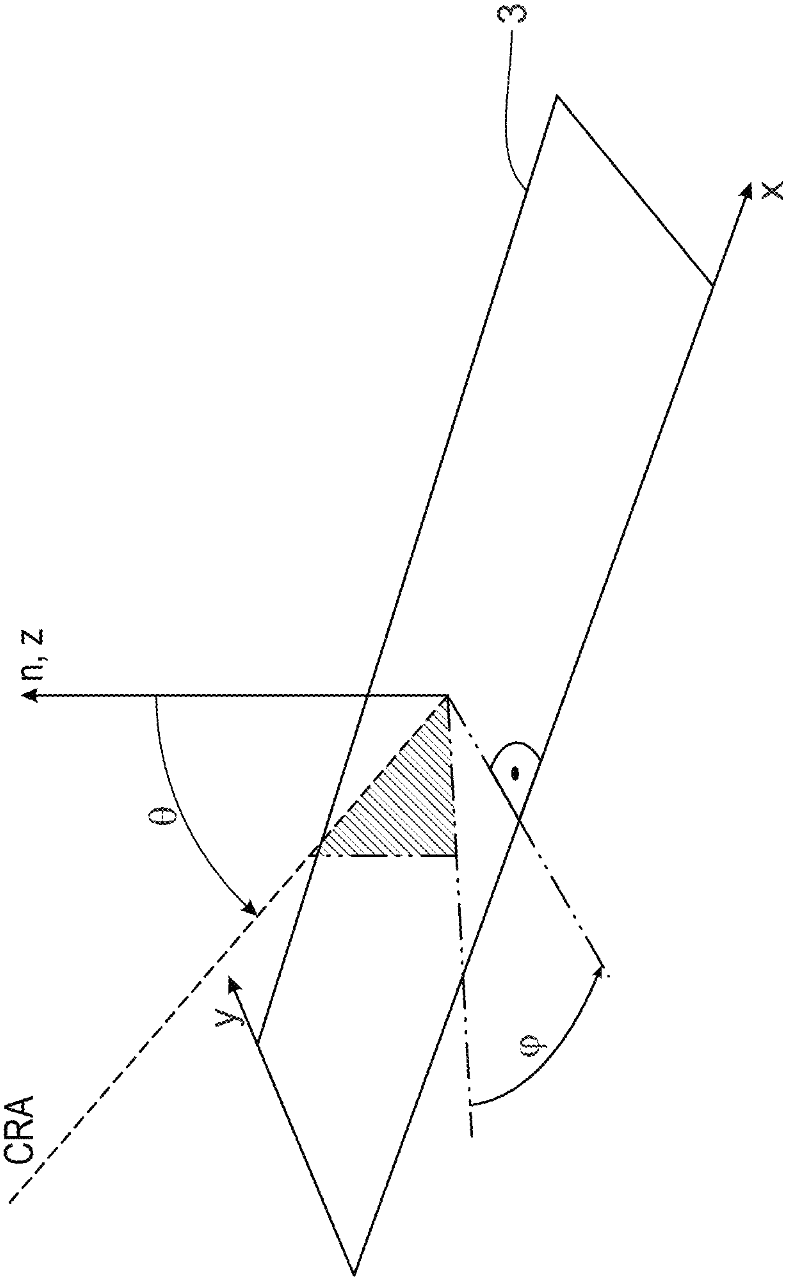
FIG. 23A shows, in perspective, an object field which is rectangular in this case and has a chief ray incident on an object field point, for the purpose of defining two chief ray angles of incidence.

FIG. 23A also illustrates angles θ, φ used for characterizing an incidence of a chief ray CRA on the object field 3 and serving to parameterize the chief ray angle of incidence in two angle dimensions. Here, θ is the angle of incidence of the chief ray CRA relative to a normal n to the object field 3, i.e. to a normal to the object plane 4 parallel to the xy-plane.

φ denotes an azimuth angle between a perpendicular to the object field coordinate x, once again through the object field point of incidence of the chief ray CRA, and a projection line of the chief ray CRA in the xy-plane.

The orientation of the chief ray CRA with respect to the object field 3 can be described exactly by way of the two angles θ and φ.

In general, stop shadowing effects predominantly come to bear at angles $\theta \geq 4°$ and $\varphi \geq 100$.

The angle φ specifies a deviation of the chief ray from a meridional trajectory (parallel to the yz-plane).

The metrology system 2 measures a portion of the reticle, i.e. of the test structure 5 in the form of an aerial image. A chief ray CRA of the production system is simulated with the aid of the optical measurement system of the metrology system 2, and so a variation of a contour of the pupil stop 10 in the respective measurement position arises as a function of a simulated chief ray angle CRAi; this is a consequence of the inclination of the respective production system chief ray angle CRAi, i.e. of the respective chief ray illumination direction.

Figure 25:
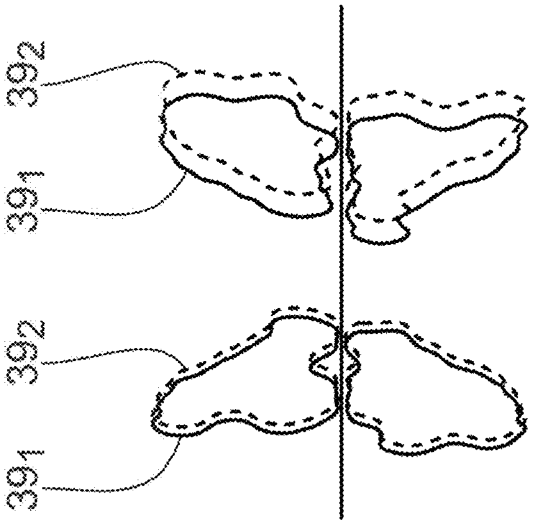
FIG. 25 shows the target stop shape for two different chief ray illumination directions that arises within the scope of the optimization method for the pupil stop according to FIG. 24.
Figure 24:
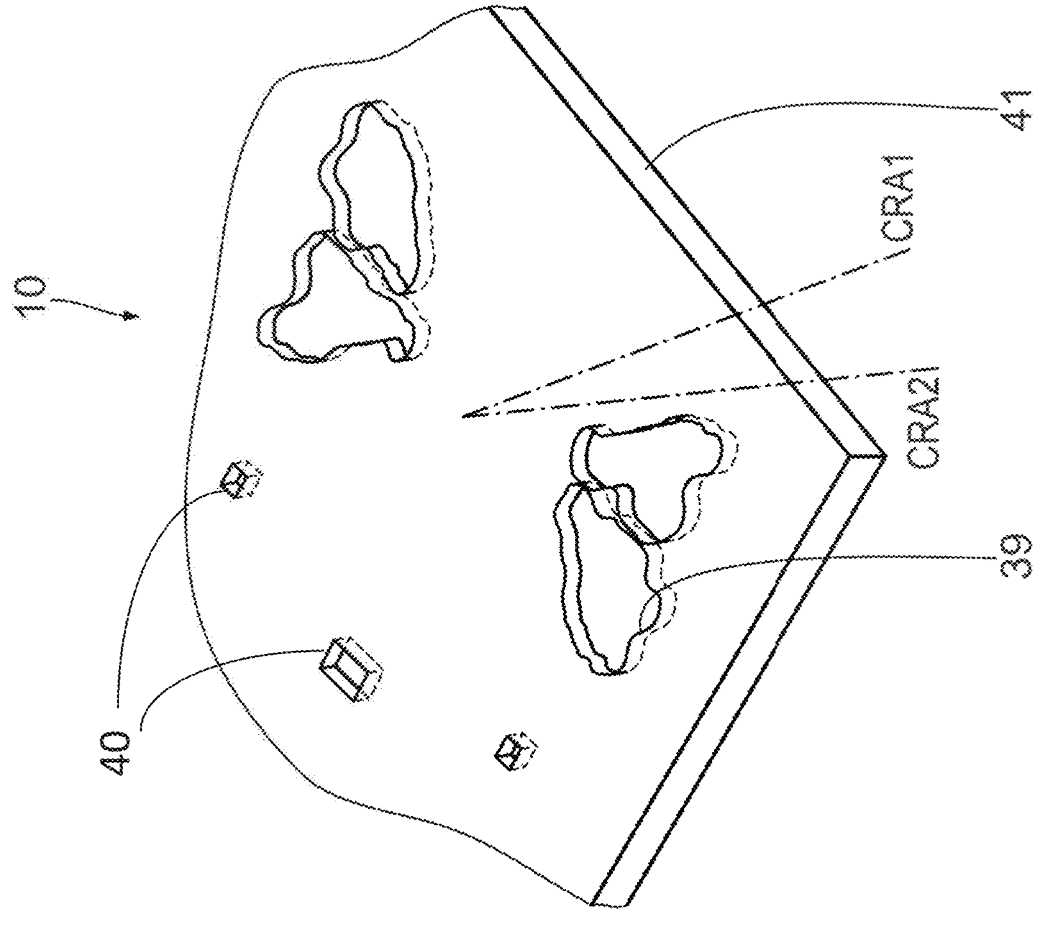
FIG. 24 shows an interrupted detail of a fabrication metal sheet having a pupil stop which may be used in the optical measurement system of the metrology system when simulating the illumination and imaging properties of the optical production system, with a stop shape of the pupil stop being optimized by use of a method for optimizing a match quality between the illumination and imaging properties of the optical production system and of the optical measurement system, with additional alignment marker openings being depicted.

FIGS. 24 and 25 illustrate this effect.

FIG. 24 shows a stop contour of an example of the pupil stop 10. An edge 39 of stop apertures of the pupil stop 10 which can be used for simulating an optical production system dipole illumination setting, for example, has a free-form design which is slightly reminiscent of an actual dipole geometry of the production illumination setting to be simulated.

In addition, FIG. 24 illustrates additional stop apertures 40, which are adjustment aids for positioning the pupil stop 10 in the pupil plane 11 and also referred to as alignment marker openings.

The pupil stop 10 according to FIG. 24 is realized by producing the stop apertures in a stop main body 41 of finite thickness.

Further, FIG. 24 by way of example plots two different chief rays (center of a beam of illumination light 1 illuminating the pupil stop 10 from below) CRA1 and CRA2 with different chief ray illumination directions. The two chief rays CRA1, CRA2 belong to different field points.

The finite thickness of the stop main body 41, inter alia, causes a slight angular space offset of the contours of the corresponding illumination pupil when the chief ray CRAi is varied, as depicted schematically in FIG. 25. An effective stop edge under illumination with the chief ray angle CRA1 is depicted at 39$_1$, and an effective stop edge under illumination with the chief ray angle CRA2 is depicted at 39$_2$.

In general, the fact that the intensities, contours and polarization properties in the illumination pupil vary when the illumination directions of the chief rays CRAi are varied also applies to the illumination pupil of the metrology system 2. In principle, the respective imaging optical units of the metrology system 2 and optical production system to be simulated also have a field variation. The upshot is that, in the optical production system, an exit pupil of the imaging optical unit, which images the object field or illumination field in the image field, regularly varies as a function of the field coordinate. This exit pupil variation is independent of the respective optical production system illumination pupil. In a manner similar to the situation presented above, contour, polarization and intensity variations arise in the metrology system 2 for different illumination directions of the chief rays CRAi.

Figure 26:
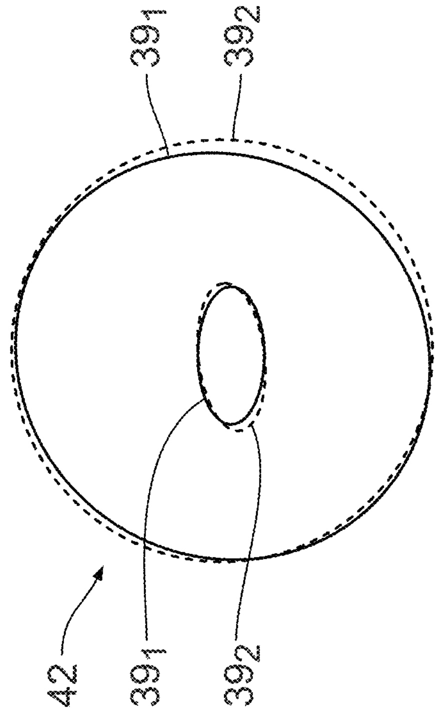
FIG. 26 shows an exit pupil stop of a projection optical unit of the optical production system, with an effective inner stop edge and an effective outer stop edge being elucidated for two different field locations or field points.

FIGS. 26 and 27 illustrate this relationship.

FIG. 26 shows stop contours of an aperture stop 42 used in the exit pupil of the optical production system imaging optical unit.

FIG. 27 shows stop contours of the aperture stop 23 in the metrology system 2, once again for two field locations which correspond to the field locations in FIG. 26.

An effective edge of an aperture stop 42 for a first chief ray angle CRA1 is depicted in FIG. 26 at 39$_1$ (solid line). The stop edge of the aperture stop 42 for a further, different chief ray angle CRA2 is depicted at 39$_2$ (dashed line).

Accordingly, FIG. 27 also depicts the effective stop edges 39$_1$, 39$_2$ of the aperture stop 23 for the two chief ray angles CRA1 and CRA2.

A variation in the field point leads to a change in the aperture edge, intensity distribution (apodization), and phase and polarization effect; this can be described by way of a Jones pupil J_production_system_1/2 or J_metrology_system_1/2 for two field & chief ray variants CRA1 and CRA2 in the optical systems.

A person skilled in the art finds details in this respect and, in particular, in respect of the Jones formalism in M. Totzeck, P. Gräupner, T. Heil, A. Göhnermeier, O. Dittmann, D. Krähmer, V. Kamenov, J. Ruoff, and D. Flagello, "How to describe polarization influence on imaging," Proc. SPIE 5754, 23-37 (2005), and in the textbook "Field Guide to Polarization" by E. Collett, SPIE Press Book, 2005.

Thus, as a rule, the following dependencies have to be considered when simulating aerial image properties of the optical production system using the metrology system 2, especially in the sub-nanometer range, i.e. on a picometer scale:

- a field dependence of an optical production system illumination pupil;
- a chief ray angle dependence of the metrology system illumination pupil;
- a field dependence of an exit pupil of the optical production system imaging optical unit;
- a chief ray angle dependence of an exit pupil of the imaging optical unit 20 in the metrology system 2.

These effects can be considered in the simulation method described herein, to be precise both during the reconstruction, as described below, and during the forward propagation, as described below.

In a manner corresponding to the explanations given above in relation to FIGS. 24 and 25, FIGS. 28A to 28D illustrate deviations between effective stop edges of the pupil stop 10 on account of different illumination directions of chief rays CRA1, CRA2.

Figure 28A:
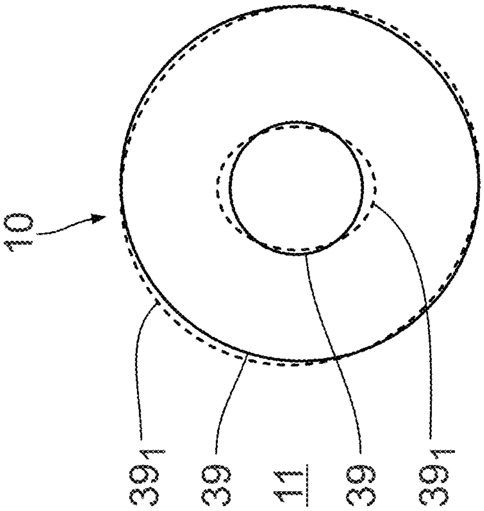
FIGS. 28A to D show different variants or measurement position sequences of metrology system pupil stops in the style of FIGS. 11 to 14 in a representation similar to FIGS. 26 and 27, depicting firstly an ideal stop shape and secondly an actually effectively acting stop edge shape which depends on the respective illumination chief ray angle utilized.
Figure 28B:
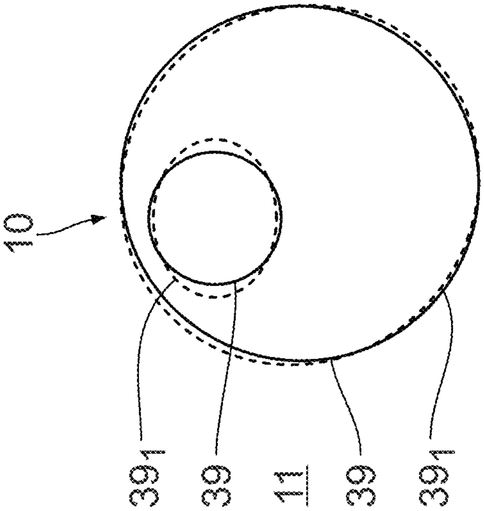
Figure 28C:
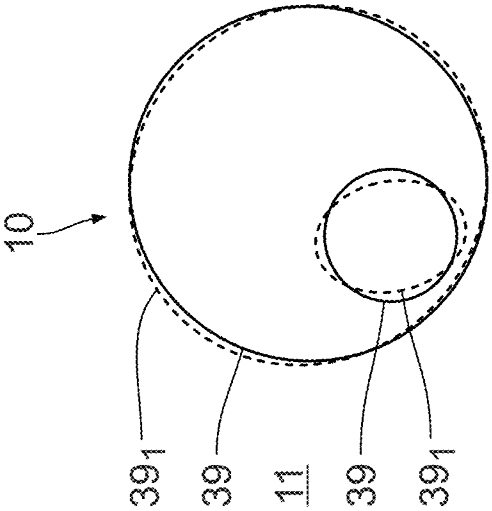
Figure 28D:
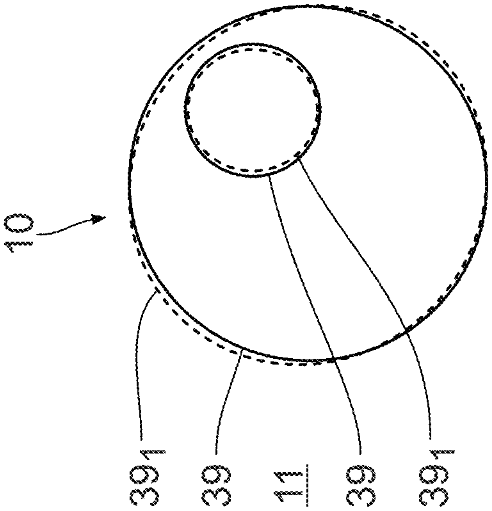

The finite thickness of the stop main body 41 leads to differences in the effective stop contours of the respective pupil 10 in the measurement positions according to FIG. 11A (FIG. 28A), 11E (FIG. 28B), 11G (FIG. 28C) and 11C (FIG. 28D).

In FIGS. 28A to 28D, the edge 39 of the respective pupil stop 10 is depicted using a solid line for an ideal shape 39 and using a dashed line as an effective stop edge 39$_1$ for a specific illumination direction of a chief ray CRA. For instance, this respective effective stop edge 39$_1$ arises on account of shadowing effects, as explained above. It should be observed that in the various measurement positions depicted in FIGS. 28A to 28D only the inner stop edge varies in a manner dependent on the measurement position; by contrast, the variation of the outer stop edge is independent of the measurement position since the same outer edge is present here in each case in a rotationally invariant fashion.

For typical measurement sequences by the metrology system 1, a plurality of focus stacks (variation of $z_m$, cf. FIG. 1) are recorded with the same position of the aperture stop 23 but with a different measurement position of the pupil stop 10. While the effective stop contour of the aperture stop 23 remains the same, the effective stop edge of the pupil stop 10 of the metrology system 2 is different in the respective measurement positions, as illustrated by the comparison of the effective stop edges 39$_1$ in FIGS. 28A to 28D.

The (known) effective aperture contours 39$_i$ can be taken into account when reconstructing the complex mask spectrum. To this end, the effective aperture contours 39$_i$ can for instance be ascertained by optical simulations (e.g. by way of ray tracing) of the illumination and projection optical unit. Further, it is also possible to measure these directly by way of a pupil image. For instance, Bertrand optics can be used to this end.

Each illumination direction produces a complex-valued field distribution $m(\vec{r}, \vec{p})$ (cf. the field distribution 19 in FIG. 17) in the object plane 4 as a result of interaction with the test structure 5. This distribution depending on not only the field point $\vec{r}$ but also the illumination direction $\vec{p}$ is explicitly taken into account here. The field distribution interferes in the entrance pupil 24 of the imaging optical unit 20 to form a likewise complex-valued diffraction spectrum $M(\vec{k}, \vec{p})$ (cf. diffraction spectrum 21 in FIG. 19) corresponding to the Fourier transform of the field distribution m of the test structure 5. The propagation through the projection optical unit 20 of the metrology system 2 can be modelled by multiplication with the known, complex-valued transfer function P of the projection optical unit 20:

$$P(\vec{k}, z) = NA(\vec{k})e^{i\frac{2\pi}{\lambda}z\sqrt{1-|k|^2}} \tag{1}$$

Here, $$NA(\vec{k}) = \begin{matrix} 1 \text{ for } |k| \le NA \\ 0 \text{ for } |k| > NA \end{matrix}$$

is the curtailment by the numerical aperture of the imaging optical unit 20, i.e. by the imaging pupil stop 23, and $$e^{i\frac{2\pi}{\lambda}z\sqrt{1-|k|^2}}$$

is the wavefront error caused by a defocus z (displacement by the object holder 17). Now, for this curtailment by the aperture stop 23, the effective stop edge $\mathbf{39}_i$ is set in accordance with the explanations relating to FIG. 27 in particular.

The propagated spectrum (cf. FIG. 21) now interferes to form the field distribution 28 in the image plane 29. The camera measures the intensity 31 of the field distribution 28 integrated over all illumination directions of the illumination system. Thus, the aerial image measured with the defocus z and the illumination direction $\vec{q}$ can be described as follows and can be simulated by inserting a candidate for the mask spectrum M:

$$I_{sim}(\vec{r}, z, \vec{q}) = \int d\vec{p}\sigma(\vec{p}, \vec{q})\left|\int d\vec{k}M(\vec{k}, \vec{p})P(\vec{k}, z)\, e^{i\vec{k}\vec{r}}\right|^2 \tag{2}$$

In this case, $\vec{r}$ is the xy-position of the intensity measurement, i.e. the respective pixel of the camera 27.

$\vec{q}$ is the illumination direction and $\vec{p}$ is the pupil coordinate. An illumination direction $\vec{q}$ corresponds to a center of a stop aperture of the respective pupil stop 10 in the respective measurement position.

For $\sigma(\vec{p}, \vec{q})$, the effective stop edges of the pupil stops 10 at the different measurement positions are used in accordance with the explanations given above, especially in the context of FIGS. 28A to 28D.

The object now is to determine the mask spectrum $M(\vec{k}, \vec{p})$. In this case, $\vec{k}$ is the pupil coordinates in the entrance pupil 24 of the projection optical unit 20 and $\vec{p}$ is the illumination direction.

The Fourier transform of the respective mask spectrum of the associated mask transfer function.

The reconstructed spectra can then be used to calculate the aerial image for any other illumination setting $\sigma_{target}(\vec{p})$) and any defocus $z_{target}$. This is also referred to as forward propagation.

The determination of $M(\vec{k}, \vec{p})$ can be formulated as an optimization problem: Sought are the spectra $M(\vec{k}, \vec{p})$ for which there is a minimum deviation F between the simulated aerial images and the aerial images $I_{meas}$ measured at the defocus positions $z_1, z_2 \ldots z_N$ and the illumination directions $\vec{q}_1, \vec{q}_2 \ldots \vec{q}_M$. The following optimization problem should be solved:

$$\min_{M(\vec{k},\vec{p})} F = \min_{M(\vec{k},\vec{p})} \sum_n \sum_m \int d\vec{r}\left|I_{sim}(\vec{r}, z_n, \vec{q}_m) - I_{meas}(\vec{r}, z_n, \vec{q}_m)\right|^2 \tag{3}$$

A separate spectrum is reconstructed for each illumination direction $\vec{p}$.

A simulated aerial image $I_{sim}$ for the target illumination setting $\sigma_{target}$ and the target defocus $z_{target}$ can be calculated using the reconstructed directionally dependent spectrum:

$$I_{sim}(\vec{r}, z, x^m) = \int d\vec{p}\sigma_{target}(\vec{p}, x^m)\left|\int d\vec{k}M(\vec{k}, \vec{p})P(\vec{k}, z_{target}, x^m)e^{i\vec{k}\vec{r}}\right|^2 \tag{4}$$

The setting for the target illumination setting $\sigma_{target}$ now also depends on the field position $x^m$ of an intensity measurement position in the object field 3. This dependence corresponds to the variation depicted in FIG. 23 by way of example.

Thus, an actual intensity distribution $BP_{xm}$ in the optical production system illumination pupil BP is used for each intensity measurement position. This intensity distribution can be ascertained from an optical simulation of the optical production system or from a measurement of an optical production system illumination unit. This actual intensity distribution in the optical production system illumination pupil is assumed to be known.

A dependence of an exit pupil contour of the optical production system imaging optical unit on, firstly, the field position and/or on the chief ray angle can be taken into account by way of a field-dependent transfer function of the optical production system imaging optical unit:

$$P(\vec{k}, z, x^m) = NA_{Scanner}(\vec{k}, x^m)e^{i\frac{2\pi}{\lambda}z\sqrt{1-|k|^2}} \tag{5}$$

Here, $NA_{Scanner}(\vec{k}, x^m)$ is the description of the stop edge $\mathbf{39}_m$ of the optical production system aperture stop 42, dependent on the field pose $x^m$ (cf. also the above description in relation to FIG. 26).

The reconstruction thus includes that profiles of edge contours of the pupil stops 10 at the respective measurement position, i.e. of measurement illumination settings specified by stop contours 39 of the pupil stop 10, change in manner which is dependent on a respective displacement position of the pupil stop 10 and which goes beyond a pure displacement of the edge contours.

Equation (4) then allows comparison between the simulated aerial image $I_{sim}$ and the respectively measured aerial image $I_{meas}$, and this can be used to reconstruct the mask spectrum M and, accordingly, the complex mask transfer function.

From Equation (4), the 3-D aerial image can be calculated with the aid of the reconstructed mask transfer function M and the illumination setting $\sigma_{target}$ of the optical production system. In this way, it is possible to ascertain what the aerial image of the test structure 5 would look like if it were imaged by the optical production system.

As an alternative to the method described in the previous section, a correction approach analogous to DE 10 2019 206 651 A1 is also possible in place of a completely synthetic calculation of the images by propagating the reconstructed mask spectrum. To this end, a correction term Δ is calculated:

$$\Delta = I_{sim}(\vec{r}, z, x^m) - I_{sim}(\vec{r}, z, \vec{q}) \tag{6}$$

The two terms $I_{sim}(\vec{r}, z, x^m)$ and $I_{sim}(\vec{r}, z, \vec{q})$ correspond to those in Equations (4) and (2) above. A precondition for this is that measurements are performed for the same focus poses and illumination stop positions as for the target settings.

The correction term Δ corresponds to the difference in the aerial images produced by the CRA/field dependence. Thus, the CRA/field dependence can be corrected as follows:

$$I(\vec{r}, z, x^m) = I_{meas}(\vec{r}, z_n, \vec{q}_m) + \Delta \tag{7}$$

In this correction approach, systematic/constant errors compensate one another in the mask spectrum reconstruction, i.e. the same deviations in $I_{sim}(\vec{r}, z, x^m)$ and $I_{sim}(\vec{r}, z, \vec{q})$, and do not make an unwanted contribution to the final image. As a result, it is possible to obtain effects/properties in the measurement data even if these are not taken into account in the object reconstruction imaging model. An example are 3-D mask effects in a reconstruction with a simple imaging model without explicit consideration of 3-D mask effects. In the limit case of a reconstruction with a negligible residue, i.e. F→0 in Equation (3), both methods (propagation and correction approach) are equivalent.

Figure 29:
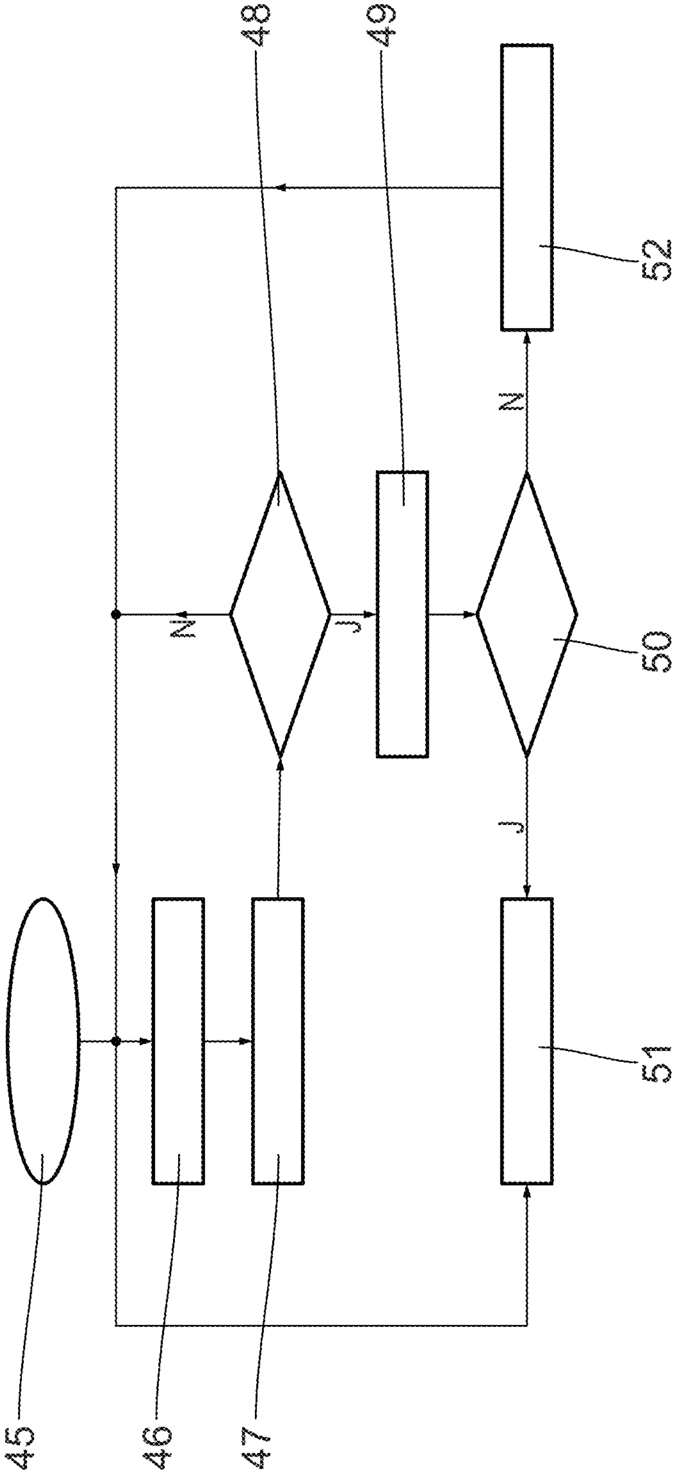
FIG. 29 shows a flowchart of a method for optimizing a stop shape of a pupil stop in the metrology system for simulating illumination and imaging properties of the optical production system when the object is illuminated and imaged by use of the optical measurement system of the metrology system.

For the pupil stop 10 of the metrology system 2, the simulation method can make use either of stop basic shapes corresponding to those already explained above, especially in the context of FIGS. 2 to 9, or of at least one pupil stop 10 whose stop edge was optimized according to a method as described below, which is described below on the basis of FIG. 29:

In a predefining step 45, firstly a starting stop shape of the sigma stop 10, 10$^{dc}$, is selected as an initial design candidate for the simulation.

In the context of the optimization, this starting stop shape 10$^{dc}$ is modified in a modifying step 46, such that a modification stop shape 10$^{dcnew}$ that is slightly changed in regard to its boundary shape arises in a producing step 47.

In a checking step 48, a check is then made to establish whether this modification stop shape 10$^{dcnew}$ satisfies at least one fabrication boundary condition with regard to the fabrication of this modification stop shape 10$^{dcnew}$. If the checking step 48 reveals that at least one marginal check portion of the modification stop shape 10$^{dcnew}$ does not satisfy the fabrication boundary conditions (decision "N" of the checking step 48), the modification step 46 and the producing step 47 are repeated on the basis of the last valid design candidate. This is done until the checking step 48 for a modification stop shape 10$^{dcnew}$ then given reveals compliance with the predefined fabrication boundary conditions (decision "Y" of the checking step 48).

An ascertaining step 49 then involves communicating the match quality between the illumination and imaging properties of the optical production system and the illumination and imaging properties of the optical measurement system.

A value of at least one merit function is calculated in the context of this match quality ascertainment. Said merit function is influenced by a comparison of optical illumination and imaging parameters between a pupil overlap region of an illumination pupil and an imaging pupil of the optical production system, on the one hand, and a corresponding pupil overlap region of an illumination pupil with a used stop shape of the sigma stop 8 and an imaging pupil with a used NA aperture stop 11 of the optical measurement system.

Figure 30:
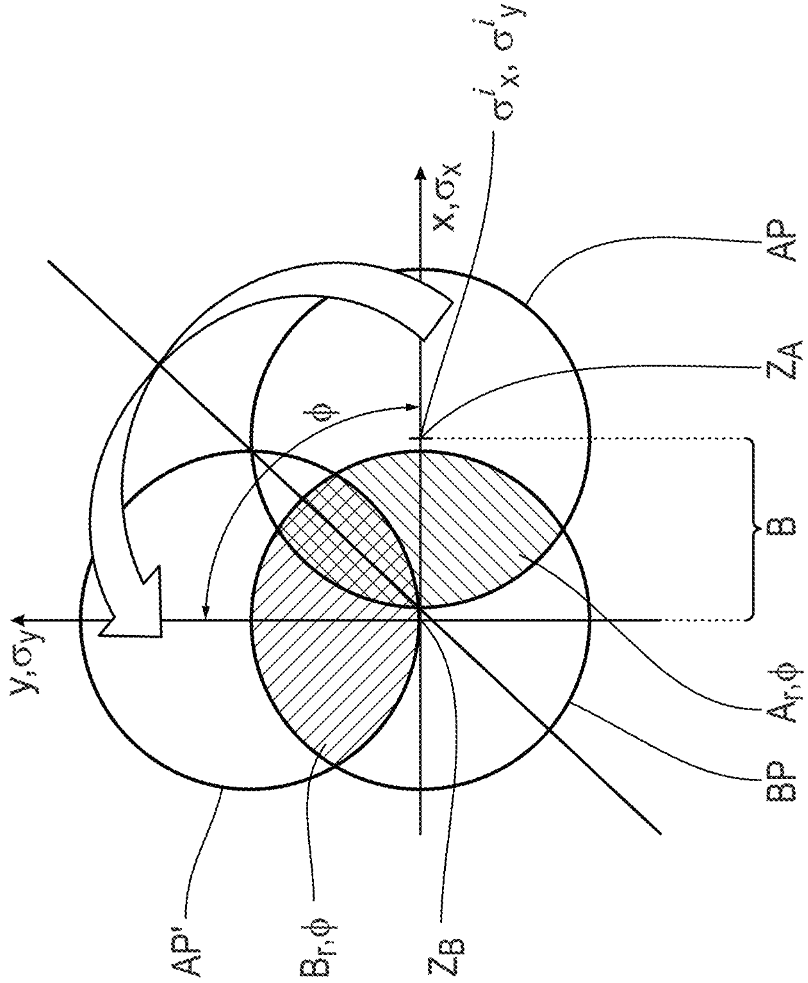
FIG. 30 schematically shows an instantaneous overlap between an illumination pupil and a pupil of the imaging optical unit of an optical system having an illumination optical unit and an imaging optical unit, for elucidating a method for optimizing a match quality between the illumination and imaging properties of the optical production system and of the optical measurement system.

FIG. 30 shows such a pupil overlap region $A_{r,\phi}$ between an illumination pupil BP and an imaging pupil AP.

A center $Z_{Ar,\phi}$ of the exit pupil AP lies at Cartesian coordinates $$\sigma_x^i, \sigma_y^i.$$

Instead of Cartesian coordinates $\sigma_x$, $\sigma_y$, it is also possible to choose polar coordinates, likewise illustrated in FIG. 30. In this case, $\sigma_\phi$ denotes the distance between a center $Z_B$ of the illumination pupil BP and the center $Z_A$ of the exit pupil AP. Φ denotes the angle between the distance $\sigma_\phi$ and for example the $\sigma_y$-axis, as depicted in FIG. 30. In the case illustrated, ϕ is 90°.

In the context of ascertaining the match quality with the aid of such a pupil overlap region $A_{r,\phi}$, the overlap at various support points $$\sigma_x^i, \sigma_y^i$$

that are scanned is assessed. The following assessment terms are used in this case:

$$D_{r,\phi} = \int_{A_{r,\phi}} d\sigma_X d\sigma_Y I(\sigma_x, \sigma_y) \tag{8}$$

$$T_{r,\phi} = \int_{A_{r,\phi}} d\sigma_x d\sigma_y \sigma_\phi(\sigma_x, \sigma_y) I(\sigma_x, \sigma_y) \tag{9}$$

D here is a term describing a simple summation of the intensities $I(\sigma_x,\sigma_y)$ over the respective pupil overlap region $A_{r,\phi}$. This D term (according to Equation (8)) correlates with an image dimension CD (critical dimension), i.e. a width of a structure along a predefined direction.

Reference is made to U.S. Pat. No. 9,176,390 B in the context of the definition of the parameter CD.

The T term (according to Equation (9)) represents an integral over the overlap region A, said integral again being weighted with the distance value $\sigma_\phi$. For this formulation of the T term, it is assumed for simplification that the exit pupil has no apodization. This T term correlates with the imaging telecentricity imaging parameter. This can include a sensitivity of an object structure offset as a function of a defocus position of a substrate onto which the object is imaged.

For a given pupil stop shape of the pupil stop 10, the following optimization rules are applied when ascertaining the match quality for all possible overlap regions $A_{r,\phi}$:

$$D^{dc}_{r,\phi} - D^{t}_{r,\phi} = 0 \text{ for alle Wertepaare } r, \phi \tag{10}$$

$$T^{dc}_{r,\phi} - T^{t}_{r,\phi} = 0 \text{ for alle Wertepaare } r, \phi \tag{11}$$

In this case, dc stands for the respective design candidates, i.e. for the currently considered stop shape of the pupil stop 10. t stands for the target illumination pupil of the optical production system, i.e. in particular of a projection exposure apparatus in the form of a scanner.

The optimization rules in accordance with Equations (10) and (11) are not attained as a rule. When ascertaining the match quality, the stop shape of the design candidate dc is varied until the optimization rules (10), (11) yield minimum values.

Besides the optimization variables D and T, further variables correlated with further illumination and/or imaging parameters can also be used when ascertaining the match quality. One example of such a variable is:

$$HV_{r,\phi} = D_{r,\phi} - D_{r,\phi-90^\circ} = \int_{A_{r,\phi}} d\sigma_x d\sigma_y I(\sigma_x, \sigma_y) - \int_{B_{r,\phi}} d\sigma_x d\sigma_y I(\sigma_x, \sigma_y) \tag{12}$$

This HV term correlates with an imaging variable "HV asymmetry", which quantifies a difference in the critical dimensions (CDs) along a vertical and along a horizontal dimension. The HV term may be of interest depending on the structures to be imaged on the object 5; for example in the case of horizontal or vertical lines to be imaged, in particular having the same periodicity and the same target CD, or else in the case of so-called contact holes, i.e. structures having an xy-aspect ratio in the region of 1. An HV asymmetry can then be understood as the difference between the two CDs, i.e. $CD_h$–$CD_v$ in the case of horizontal (h) and vertical (v) lines or $CD_x$–$CD_y$ in the case of contact holes having extents in the x- and y-directions.

Ascertaining the HV term according to Equation (12) above involves calculating the difference between two D terms according to Equation (8) at the location of two defined overlap regions $A_{r,\phi}$ and $B_{r,\phi}$ which are rotated with respect to one another by 90° about the coordinate origin $Z_B$ (cf. FIG. 30). In order to calculate the integral in the overlap region, the overlap between for example the entrance pupil BP and an exit pupil AP' correspondingly rotated by 90° is taken into consideration.

For the HV term, too, there is then a corresponding optimization rule:

$$HV^{dc}_{r,\phi} - HV^{t}_{r,\phi} = 0 \text{ for alle Wertepaare } r, \phi \tag{13}$$

After comparison calculation has been carried out, the overlap regions $A_{r,\phi}$ used cover the entire illumination pupil of, on the one hand, the optical production system and, on the other hand, the illumination optical unit 9 of the metrology system 2.

Figure 30A:
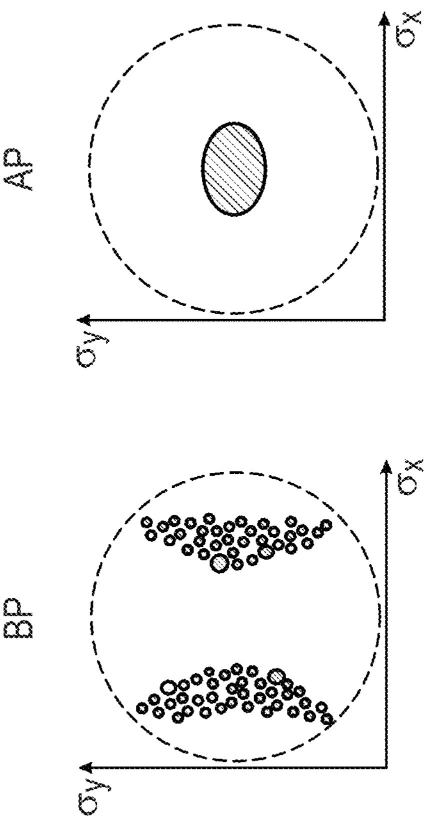
FIG. 30A shows an illumination pupil (on the left) and a projection optical unit exit pupil (on the right) of an optical production system which is simulated in regard to its optical properties by way of the metrology system.
Figure 30B:
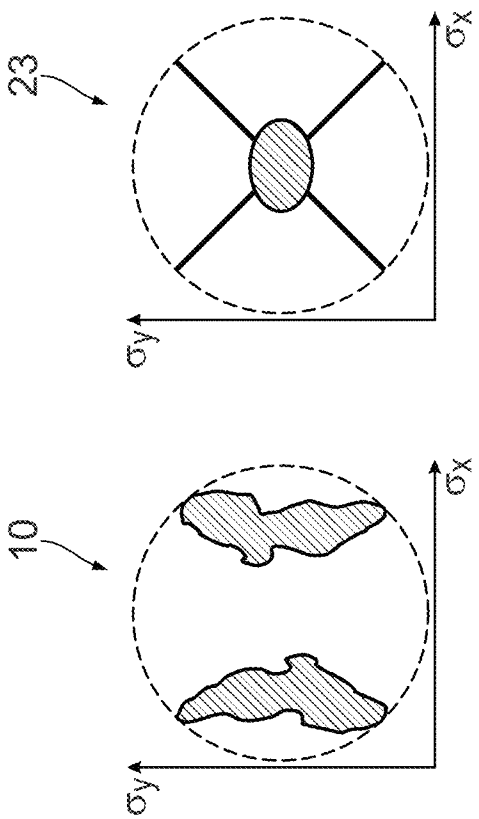
FIG. 30B shows a sigma pupil stop shape (on the left) and an NA aperture stop shape (on the right) of the optical measurement system of the metrology system for simulating the pupil configurations according to FIG. 30A which were found in the context of a stop shape optimization method.

FIGS. 30A and 30B show two pupil pairs of, on the one hand, the optical production system (FIG. 30A) and, on the other hand, the optical measurement system of the metrology system 2 (FIG. 30B), which are compared with one another in the context of the match quality ascertainment explained above in the context of FIG. 30, in particular.

FIG. 30A shows on the left an illumination of an illumination pupil for an x-dipole illumination setting. FIG. 30A shows on the right an exit pupil of the projection optical unit of the optical projection system with a central, approximately elliptical pupil obscuration.

The illumination setting to be simulated (cf. FIG. 30A on the left) of the optical production system can be composed of a multiplicity of individual spots in the illumination pupil, corresponding to a faceted configuration of an illumination optical unit of the optical production system, for example a configuration having a field facet mirror and a pupil facet mirror or a configuration in which a MEMS mirror configuration is used within the illumination optical unit. The size of the respective individual spot in FIG. 30A on the left is a measure of the brightness of this individual spot, i.e. of the illumination intensity from the illumination direction assigned to this individual spot.

FIG. 30B shows on the left a target stop shape—obtained by use of the optimization method—of the pupil stop 10 for the simulation of the illumination and imaging properties of the optical production system with the illumination setting and the exit pupil according to FIG. 30A. FIG. 30B shows on the right the exit pupil of the imaging optical unit of the optical measurement system with the central obscuration that is produced by way of the aperture stop or NA stop 23.

A merit function E can be used during the match quality ascertainment since, in general, the match rules according to Equations (10), (11) and (13) do not all become 0 at the same time. This merit function can be written as weighted error minimization in the usual way as:

$$E(I(\sigma_x, \sigma_y)) = w_D \sum_{i,\phi} (D_{i,\phi}(I(\sigma_x, \sigma_y)) - D_{i,\phi}(I^t(\sigma_x, \sigma_y)))^2 + w_T \sum_{i,\phi} (T_{i,\phi}(I(\sigma_x, \sigma_y)) - T_{i,\phi}(I^t(\sigma_x, \sigma_y)))^2 + \ldots \tag{14}$$

I here denotes the stop shape of the pupil stop $\mathbf{10}^{dcnew}$ which is intended to be assessed by use of the merit function. $I^t$ denotes the target illumination pupil of the optical production system, this being the intended target of optimization. D and T denote the assessment terms discussed above in the context of Equations (10) and (11). In addition, the merit function E can for example also be extended by the assessment term HV (cf. Equations (12) and (13)).

The merit function I can additionally be extended by the requirement for a minimum transmission of the pupil stop $\mathbf{10}^{dcnew}$.

Besides the target illumination pupil of the optical production system, the ascertaining step 49 can also be influenced by a pupil transfer function of the optical production system and a pupil transfer function of the optical measurement system of the metrology system 2.

For this purpose, the D term defined above in the context of Equation (8) can be written as follows:

$$D_{r,\phi} = \int_{-\infty}^{+\infty}\int_{-\infty}^{+\infty} d\sigma_x d\sigma_y I(\sigma_x, \sigma_y) P_{r,\phi}(\sigma_x, \sigma_y)$$

P here is an apodization function, i.e. an energetic proportion of the pupil transfer function.

An apodization of the exit pupil can then be taken into account by this means.

In the course of the ascertaining step 49, compliance with an optimization criterion is queried in an optimization query step 50. One example of such an optimization criterion is the Boltzmann criterion of simulated annealing:

$$\text{erf}\ddot{u}llt\ r < P\,(dc, dc_{new})\ mit\ P\,(dc, dc_{new}) = e^{-\beta(E(dc_{new})-E(dc))}$$

In this case, r is a uniformly distributed random number from the interval [0,1[ (the exact numerical value "1" is thus excluded in this interval) and β is a control parameter that increases further and further in the course of the simulated annealing optimization. $E(dc_{new})$ and E(dc) are the merit functions that arose for the stop shapes of the pupil stop 10 during the last and during the preceding optimization step.

Insofar as the Boltzmann criterion is satisfied, i.e. the optimization has not yet concluded (decision Y in the query step 50), the current stop shape $\mathbf{10}^{dcnew}$ is set as initial stop shape $\mathbf{10}^{dc}$ for the next modification, which is effected in a predefining step 51. The control parameter 3 is also increased in the predefining step 51. The optimization criterion is thus intensified in the context of the predefining step 51. Afterwards, the method continues with the modifying step 46 and steps 47 to 50 are repeated until the optimization query step 50 reveals that either the Boltzmann criterion is no longer satisfied or the control parameter β is greater than a predefined value (query result N in the query step 50).

If, therefore, the optimization criterion has then been attained in the optimization query step 50 (query result N), the pupil stop 10 with the target stop shape that occurred with the smallest merit function value E in the optimization is fabricated in a fabricating step 52.

FIG. 24 shows such a target stop shape 39.

Exactly one pupil stop 10, which was optimized as explained above in the context of FIGS. 29 to 30B, can be used for each optical production system illumination setting.

Individually optimized stops can be designed for a given selection of field points $x^i$, e.g. three field points (left x-field edge, field center, right x-field edge), and so the contributions of, firstly, the optical production system and, secondly, the metrology system 2 which are valid for this field point $x^i$ or for this illumination direction of the respective chief ray CRAi are taken into account more completely, and there is an accordingly improved simulation of the optical production system aerial image. This specification of individual optimized stop edges can be implemented accordingly for the pupil stop 10, for the aperture stops 23 and also for both stops 10, 23.

For instance, the three pupil stops 10 and optionally three aperture stops 23 optimized thus are then available for the metrology system 2. In a manner fitting to the field point $x^m$ to be measured in the object field 3, it is then possible to use the corresponding stop or the corresponding stop pair of pupil stop and aperture stop.

If there is no coincidence between a field point $x^m$ to be measured and a specified field point for which the respective stop was optimized in respect of its edge, then it is possible to use a compensation rule. An example of such a compensation rule is:

$$\langle A(x, y)\rangle^m = A(x, y)^r \frac{\Delta x^{m-l}}{\Delta x} + A(x, y)^l \frac{\Delta x^{r-m}}{\Delta x} \quad (15)$$

Here, A(x, y) denotes the aerial image measured by the metrology system 2.

Figure 31:
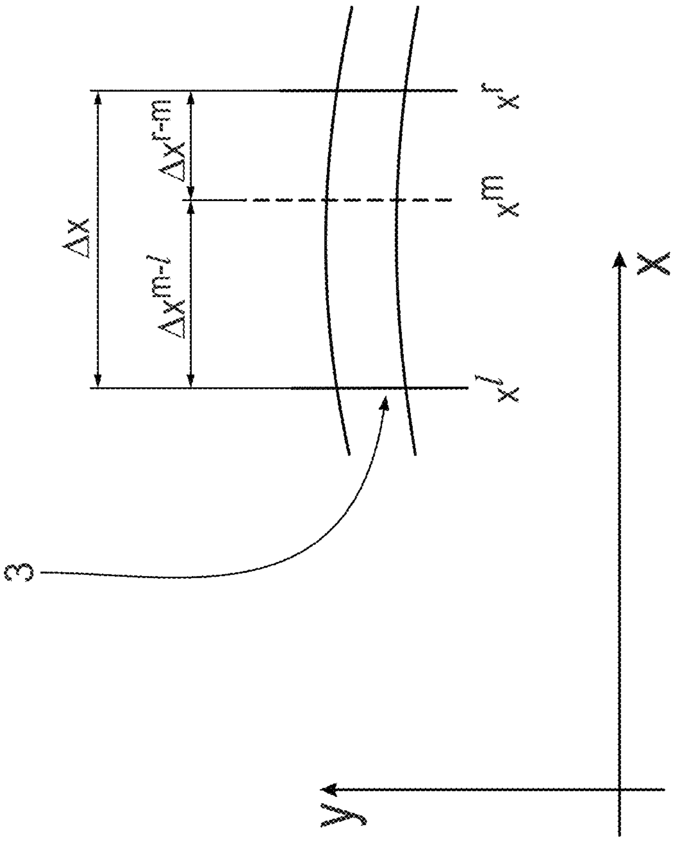
FIG. 31 schematically shows a representation of the object field for elucidating an averaging of aerial images if no physical stop is available at a measurement point.

FIG. 31 shows the definitions of the distances Δx according to above Formula (15). The index m denotes the field point on the mask where a detail should be measured. No dedicated stop is available for this field point in the object field 3. Now, two aerial images are recorded at the point $x^m$: once with the stop designed and present for a field point $x^l$ adjacent to the left, and once with the stop designed and present for a field point $x^r$ adjacent to the right. Weighting is simply linear with the corresponding relative distances, as shown in the formula above. In the limit case where $x^m$ approaches e.g. $x^r$, the aerial image $A(x, y)^r$ is thus obtained with an ever higher weighting.

In a variant of the simulation method, it is also possible to use a plurality of different pupil stops 10 to specify the various measurement positions ($k_x$, $k_y$).

To prepare the simulation method, it is possible to record an aerial image stack in order to make sure which z-pose of the object plane 4 supplies an optimally sharp image in the image plane 29 (zero of the z-pose).

z-increments which are used in Equation (2) when determining the aerial image $I_{sim}$ may differ from the defocus values $z_m$ that are specified within the scope of the simulation method.

Pixel sizes of the recorded measurement aerial images $I_{meas}$ may be re-sampled for the purpose of matching to a desired pixel resolution.

A plurality of $k_x$, $k_y$ positions of the imaging pupil stop 23 can also be set by way of the displacement drive 25 in a simulation method.

When reconstructing the mask transfer function, it is accordingly possible to take account of imaging aberrations of the optical measurement system, in particular imaging aberrations of the imaging optical unit 20 of the metrology system 2.

The determination of the 3-D aerial image $I_{meas}$ and/or the calculation of the simulated aerial image $I_{sim}$ may be carried out using a different illumination chief ray angle to that of the reconstruction of the mask transfer function.

For selecting the respective pupil stop 10 from the provided plurality of pupil stops 10 with in each case different stop edge shapes and/or stop edge orientations, the metrology system 2 has a selection apparatus not depicted in detail in the drawing. This selection apparatus has a stop storage unit, in which the plurality of pupil stops 10 with different stop edge shapes and/or stop edge orientations are stored in each case for the purpose of specifying correspondingly different measurement illumination settings.

In the selection step of the simulation method, the last pupil stop inserted is firstly removed from its use location in the pupil plane 11 and supplied to the stop storage unit in the selection apparatus with the aid of an actuator system of the selection apparatus, in particular with the aid of a robotic actuator system. Subsequently, the pupil stop 10 selected according to the simulation method is selected from the stop storage unit and inserted in the use position in the pupil plane 11 with the aid of the robotic actuator system.

In principle, the problem presented above and also the solution can be applied analogously to take account of machine-individual properties in the aerial image emulation. For instance, the EUV illumination pupils differ from machine to machine, depending on the light source used, in particular the EUV light source used. In particular, the combination of a stop emulating the ideal system and the simulation-type method incorporating the machine-individual component is attractive.

For instance, this requires that the machine-individual properties are known, for example by way of a qualification or, in the case of the EUV source types, by way of the appropriate numerical models. Machine-individual portions of the metrology system 2 can also be considered in similar fashion.

In general, the above-described approaches allow specific properties of the optical production system to be simulated, for example crosstalk effects between different illumination channels of a fly's eye integrator system in the illumination optical unit of the optical production component and/or crosstalk effects between various x-coordinate-dependent intensity correction stops in the illumination optical unit of the optical production system. For instance, it is possible to simulate insertion depths of appropriate stop fingers which correct the illumination intensity in x-coordinate-dependent fashion, and the influence thereof on the aerial image.

In some implementations, the calculations and processing of data (e.g., performing simulation) described in this document can be performed by one or more computers that include one or more data processors configured to execute one or more programs that include a plurality of instructions according to the principles described above. Each data processor can include one or more processor cores, and each processor core can include logic circuitry for processing data. For example, a data processor can include an arithmetic and logic unit (ALU), a control unit, and various registers. Each data processor can include cache memory. Each data processor can include a system-on-chip (SoC) that includes multiple processor cores, random access memory, graphics processing units, one or more controllers, and one or more communication modules. Each data processor can include millions or billions of transistors.

The methods described in this document can be carried out using one or more computers, which can include one or more data processors for processing data, one or more storage devices for storing data, and/or one or more computer programs including instructions that when executed by the one or more computers cause the one or more computers to carry out the processes. The one or more computers can include one or more input devices, such as a keyboard, a mouse, a touchpad, and/or a voice command input module, and one or more output devices, such as a display, and/or an audio speaker.

In some implementations, the one or more computing devices can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the one or more computers can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

The embodiments of the present invention that are described in this specification and the optional features and properties respectively mentioned in this regard should also be understood to be disclosed in all combinations with one another. In particular, in the present case, the description of a feature comprised by an embodiment—unless explicitly explained to the contrary—should also not be understood such that the feature is essential or indispensable for the function of the embodiment.

What is claimed is:

1. A method for simulating illumination and imaging properties of an optical production system when an object is illuminated and imaged, wherein the simulation is implemented by use of an optical measurement system of a metrology system, wherein the optical measurement system comprises an illumination optical unit for illuminating the object, having a selected pupil stop of the illumination optical unit in the region of an illumination pupil in a pupil plane, and an imaging optical unit for imaging the object in an image plane, wherein the object is displaceable perpendicular to an object plane, including the following steps:

providing at least one pupil stop for specifying a plurality of measurement illumination settings created by selecting each of the at least one pupil stop as the selected pupil stop and displacing the selected pupil stop in the pupil plane, recording measurement aerial images in the image plane for various displacement positions of the object perpendicular to the object plane with the various measurement illumination settings, wherein the various measurement illumination settings are specified by displacing each of the selected pupil stop, the various measurement illumination settings are part of the plurality of measurement illumination settings, reconstructing a complex mask transfer function from the recorded measurement aerial images to produce a reconstructed mask transfer function, and determining a 3-D aerial image of the optical production system from the reconstructed mask transfer function and a given illumination setting of the optical production system as the result of the simulation method, wherein the reconstruction takes into account profiles of stop edges of the at least one pupil stop which effectively act to specify the respective measurement illumination setting are changed in a manner going beyond a pure displacement of the stop edge when the respective measurement illumination setting is specified on the basis of the displacement position of the selected pupil stop.

2. The method of claim 1, wherein shadowing effects on account of a finite thickness of a main body of the selected pupil stop are included in a determination of a change in the profiles of the stop edges of the at least one pupil stop when the measurement illumination settings are specified.

3. The method of claim 2, wherein shadowing effects on account of a chief ray angle of an illumination of the object in the optical production system of greater than 4° are included in a determination of a change in the profiles of the stop edges of the at least one pupil stop when the measurement illumination settings are specified.

4. The method of claim 2, wherein there is a field-dependent determination of a change in the profiles of the stop edges of the at least one pupil stop when the measurement illumination settings are specified.

5. The method of claim 2, wherein a field-dependence of imaging properties of an imaging optical unit of the optical production system is included in a determination of a change in the profiles of the stop edges of the at least one pupil stop when the measurement illumination settings are specified.

6. The method of claim 2, wherein at least one of the following correction terms is included when the mask transfer function is reconstructed:

a calculated aerial image for the associated defocus value and an associated field height, created by simulating an image by use of the imaging optical unit of the optical production system with the inclusion of reconstructed spectra of the object, and/or a calculated aerial image for the associated defocus value, created by simulating an image by use of the measurement imaging optical unit with the inclusion of the reconstructed spectra.

7. The method of claim 1, wherein shadowing effects on account of a chief ray angle of an illumination of the object in the optical production system of greater than 4° are included in a determination of a change in the profiles of the stop edges of the at least one pupil stop when the measurement illumination settings are specified.

8. The method of claim 1, wherein there is a field-dependent determination of a change in the profiles of the stop edges of the at least one pupil stop when the measurement illumination settings are specified.

9. The method of claim 1, wherein a field-dependence of imaging properties of an imaging optical unit of the optical production system is included in a determination of a change in the profiles of the stop edges of the at least one pupil stop when the measurement illumination settings are specified.

10. The method of claim 1, wherein at least one of the following correction terms is included when the mask transfer function is reconstructed:

a calculated aerial image for the associated defocus value and an associated field height, created by simulating an image by use of the imaging optical unit of the optical production system with the inclusion of reconstructed spectra of the object, and/or a calculated aerial image for the associated defocus value, created by simulating an image by use of the measurement imaging optical unit with the inclusion of the reconstructed spectra.

11. The method of claim 1, wherein the recording of the measurement aerial images utilizes a pupil stop whose stop shape is optimized with the aid of the following method steps:

specifying a starting stop shape of the pupil stop as an initial design candidate for the simulation, modifying the starting stop shape to give rise to a modification stop shape which is different from the most recently predefined stop shape, checking at least one fabrication boundary condition with regard to fabrication of the modification stop shape and repeating the "modifying" and "checking" steps until the checking reveals compliance with the fabrication boundary condition, ascertaining a match quality between the illumination and imaging properties of the optical production system and the illumination and imaging properties of the optical measurement system as soon as the fabrication boundary conditions are complied with, repeating the “modifying”, “checking” and “ascertaining” steps until the match quality attains a predefined optimization criterion, which is checked by way of a query step, and fabricating a target stop shape resulting from the attaining of the optimization criterion as an optimized pupil stop shape after attaining the optimization criterion.

12. The method of claim 11, wherein the stop edge is optimized separately for a plurality of field regions and, in particular, for a plurality of field heights, with the result that this gives rise to a plurality of pupil stops which can each be used for simulating the properties of the optical production system in the corresponding field region.

13. A metrology system for simulating illumination and imaging properties of an optical production system when an object is illuminated and imaged, wherein the simulation is implemented by use of an optical measurement system of the metrology system, wherein the optical measurement system comprises an illumination optical unit serving to illuminate the object and having a selected pupil stop in the region of an illumination pupil in a pupil plane, and an imaging optical unit for imaging the object in an image plane, wherein the object is displaceable perpendicular to an object plane,- wherein the metrology system is configured to:

provide at least one pupil stop for specifying a plurality of measurement illumination settings created by selecting each of the at least one pupil stop as the selected pupil stop and displacing the selected pupil stop in the pupil plane, record measurement aerial images in the image plane for various displacement positions of the object perpendicular to the object plane with the various measurement illumination settings, wherein the various measurement illumination settings are specified by displacing each of the selected pupil stop, the various measurement illumination settings are part of the plurality of measurement illumination settings, reconstruct a complex mask transfer function from the recorded measurement aerial images to produce a reconstructed mask transfer function, and determine a 3-D aerial image of the optical production system from the reconstructed mask transfer function and a given illumination setting of the optical production system as the result of the simulation method, wherein as part of the reconstruction, the metrology system is configured to take into account profiles of stop edges of the at least one pupil stop which effectively act to specify the respective measurement illumination setting are changed in a manner going beyond a pure displacement of the stop edge when the respective measurement illumination setting is specified on the basis of the displacement position of the selected pupil stop.

14. The metrology system of claim 13, wherein the optical measurement system comprises a displacement drive for displacing the pupil stop in at least one displacement direction in the pupil plane, wherein the optical measurement system comprises an object holder which is displaceable perpendicular to an object plane by actuator.

15. The metrology system of claim 13, wherein the optical measurement system comprises a displacement drive for displacing, in at least one displacement direction in a pupil plane of the imaging optical unit, an imaging pupil stop arranged in the region of a pupil of the imaging optical unit.

16. The metrology system of claim 13, comprising a selection apparatus for selecting at least one pupil stop from a plurality of pupil stops.

17. The metrology system of claim 14, wherein the optical measurement system comprises a displacement drive for displacing, in at least one displacement direction in a pupil plane of the imaging optical unit, an imaging pupil stop arranged in the region of a pupil of the imaging optical unit.

18. The metrology system of claim 14, comprising a selection apparatus for selecting at least one pupil stop from a plurality of pupil stops.

19. The metrology system of claim 13, wherein shadowing effects on account of a finite thickness of a main body of the pupil stop are included in a determination of a change in the profiles of the stop edges of the at least one pupil stop when the measurement illumination settings are specified.

20. The metrology system of claim 13, wherein shadowing effects on account of a chief ray angle of an illumination of the object in the optical production system of greater than 4° are included in a determination of a change in the profiles of the stop edges of the at least one pupil stop when the measurement illumination settings are specified.

* * * * *